United States Patent
Chi et al.

(10) Patent No.: US 9,269,691 B2
(45) Date of Patent: Feb. 23, 2016

(54) SEMICONDUCTOR DEVICE AND METHOD OF MAKING AN EMBEDDED WAFER LEVEL BALL GRID ARRAY (EWLB) PACKAGE ON PACKAGE (POP) DEVICE WITH A SLOTTED METAL CARRIER INTERPOSER

(71) Applicant: STATS ChipPAC, Ltd., Singapore (SG)

(72) Inventors: HeeJo Chi, Kyoungki-do (KR); HanGil Shin, Seoul (KR); NamJu Cho, Gyeonggi-do (KR)

(73) Assignee: STATS ChipPAC, Ltd., Singapore (SG)

( * ) Notice: Subject to any disclaimer, the term of this patent is extended or adjusted under 35 U.S.C. 154(b) by 0 days.

(21) Appl. No.: 13/918,103

(22) Filed: Jun. 14, 2013

(65) Prior Publication Data

US 2014/0367848 A1 Dec. 18, 2014
US 2015/0091157 A9 Apr. 2, 2015

Related U.S. Application Data

(63) Continuation-in-part of application No. 13/683,946, filed on Nov. 21, 2012, now Pat. No. 9,064,859, which is a continuation of application No. 12/787,973, filed on May 26, 2010, now Pat. No. 8,349,658.

(51) Int. Cl.
*H01L 23/49* (2006.01)
*H01L 23/00* (2006.01)
(Continued)

(52) U.S. Cl.
CPC ............... *H01L 24/81* (2013.01); *H01L 21/56* (2013.01); *H01L 21/561* (2013.01); *H01L 21/568* (2013.01); *H01L 21/6835* (2013.01); *H01L 23/36* (2013.01); *H01L 23/49811* (2013.01); *H01L 23/49816* (2013.01); *H01L 23/49822* (2013.01); *H01L 23/49827* (2013.01);
(Continued)

(58) Field of Classification Search
CPC ... H01L 24/81; H01L 21/568; H01L 23/5389; H01L 23/49827; H01L 23/49816; H01L 23/552; H01L 23/36; H01L 23/49838; H01L 23/49822; H01L 21/561; H01L 23/3128; H01L 2924/13091
USPC ........................... 438/111, 112, 122; 257/675
See application file for complete search history.

(56) References Cited

U.S. PATENT DOCUMENTS 5,250,843 A 10/1993 Eichelberger
5,353,498 A 10/1994 Fillion et al.
(Continued)

*Primary Examiner* — Roy Potter
*Assistant Examiner* — Paul Patton
(74) *Attorney, Agent, or Firm* — Robert D. Atkins; Patent Law Group: Aktins and Associates, P.C.

(57) ABSTRACT

A semiconductor device has a semiconductor die. The semiconductor die is disposed over a conductive substrate. An encapsulant is deposited over the semiconductor die. A first interconnect structure is formed over the encapsulant. An opening is formed through the substrate to isolate a portion of the substrate electrically connected to the first interconnect structure. A bump is formed over the first interconnect structure. Conductive vias are formed through the encapsulant and electrically connected to the portion of the substrate. A plurality of bumps is formed over the semiconductor die. A first conductive layer is formed over the encapsulant. A first insulating layer is formed over the first conductive layer. A second conductive layer is formed over the first insulating layer and first conductive layer. A second insulating layer is formed over the first insulating layer and second conductive layer. Protrusions extend above the substrate.

24 Claims, 20 Drawing Sheets

(51) Int. Cl.
*H01L 23/36* (2006.01)
*H01L 23/498* (2006.01)
*H01L 21/56* (2006.01)
*H01L 23/538* (2006.01)
*H01L 23/552* (2006.01)
*H01L 21/683* (2006.01)
*H01L 23/522* (2006.01)
*H01L 23/31* (2006.01)
*H01L 25/10* (2006.01)

(52) U.S. Cl.
CPC ........ *H01L23/49838* (2013.01); *H01L 23/522* (2013.01); *H01L 23/5389* (2013.01); *H01L 23/552* (2013.01); *H01L 24/24* (2013.01); *H01L 24/82* (2013.01); *H01L 24/97* (2013.01); H01L 23/3128 (2013.01); H01L 24/11 (2013.01); H01L 24/13 (2013.01); H01L 24/29 (2013.01); H01L 24/32 (2013.01); H01L 24/73 (2013.01); H01L 24/92 (2013.01); H01L 25/105 (2013.01); H01L 2221/68327 (2013.01); H01L 2221/68372 (2013.01); H01L 2221/68377 (2013.01); H01L 2224/0401 (2013.01); H01L 2224/04042 (2013.01); H01L 2224/04105 (2013.01); H01L 2224/1132 (2013.01); H01L 2224/1134 (2013.01); H01L 2224/1145 (2013.01); H01L 2224/11334 (2013.01); H01L 2224/11462 (2013.01); H01L 2224/11464 (2013.01); H01L 2224/11849 (2013.01); H01L 2224/11901 (2013.01); H01L 2224/12105 (2013.01); H01L 2224/13022 (2013.01); H01L 2224/13111 (2013.01); H01L 2224/13113 (2013.01); H01L 2224/13116 (2013.01); H01L 2224/13124 (2013.01); H01L 2224/13139 (2013.01); H01L 2224/13144 (2013.01); H01L 2224/13147 (2013.01); H01L 2224/13155 (2013.01); H01L 2224/24246 (2013.01); H01L 2224/24247 (2013.01); H01L 2224/2919 (2013.01); H01L 2224/32245 (2013.01); H01L 2224/73267 (2013.01); H01L 2224/82031 (2013.01); H01L 2224/82039 (2013.01); H01L 2224/82047 (2013.01); H01L 2224/92244 (2013.01); H01L 2224/94 (2013.01); H01L 2224/97 (2013.01); H01L 2225/1035 (2013.01); H01L 2225/1041 (2013.01); H01L 2225/1058 (2013.01); H01L 2924/01322 (2013.01); H01L 2924/13091 (2013.01); H01L 2924/15151 (2013.01); H01L 2924/15311 (2013.01); H01L 2924/181 (2013.01); H01L 2924/3025 (2013.01); H01L 2924/3511 (2013.01)

(56) References Cited

U.S. PATENT DOCUMENTS

| | | | |
|---|---|---|---|
| 5,841,193 A | 11/1998 | Eichelberger | |
| 6,154,366 A | 11/2000 | Ma et al. | |
| 6,238,952 B1 | 5/2001 | Lin | |
| 6,495,914 B1 * | 12/2002 | Sekine et al. | 257/723 |
| 6,563,209 B1 | 5/2003 | Takahashi | |
| 6,683,368 B1 | 1/2004 | Mostafazadeh | |
| 6,713,859 B1 | 3/2004 | Ma | |
| 6,812,552 B2 | 11/2004 | Islam et al. | |
| 6,894,376 B1 | 5/2005 | Mostafazadeh et al. | |
| 7,411,289 B1 | 8/2008 | McLellan et al. | |
| 7,420,266 B2 * | 9/2008 | Takahashi | 257/669 |
| 7,619,901 B2 | 11/2009 | Eichelberger et al. | |
| 7,709,935 B2 | 5/2010 | Islam et al. | |
| 7,858,443 B2 | 12/2010 | Powell et al. | |
| 7,888,184 B2 | 2/2011 | Shim et al. | |
| 7,929,313 B2 | 4/2011 | Ito et al. | |
| 8,072,059 B2 | 12/2011 | Shim et al. | |
| 8,093,711 B2 | 1/2012 | Zudock et al. | |
| 8,110,441 B2 * | 2/2012 | Chandra et al. | 438/113 |
| 8,138,587 B2 * | 3/2012 | Otremba | 257/676 |
| 8,241,956 B2 | 8/2012 | Camacho et al. | |
| 8,288,209 B1 | 10/2012 | Chi et al. | |
| 8,349,658 B2 * | 1/2013 | Chi et al. | 438/123 |
| 2004/0164383 A1 | 8/2004 | Xu | |
| 2005/0263864 A1 | 12/2005 | Islam et al. | |
| 2006/0006534 A1 | 1/2006 | Yean et al. | |
| 2007/0158861 A1 | 7/2007 | Huang et al. | |
| 2007/0210423 A1 | 9/2007 | Hsu | |
| 2008/0029855 A1 | 2/2008 | Chang | |
| 2008/0315377 A1 | 12/2008 | Eichelberger et al. | |
| 2009/0091013 A1 | 4/2009 | Fukuda et al. | |
| 2009/0269891 A1 * | 10/2009 | Liu et al. | 438/127 |
| 2009/0309212 A1 | 12/2009 | Shim et al. | |
| 2009/0315170 A1 | 12/2009 | Shim et al. | |
| 2010/0127363 A1 | 5/2010 | Nondhasitthichai et al. | |
| 2010/0140779 A1 | 6/2010 | Lin et al. | |
| 2010/0237477 A1 | 9/2010 | Pagaila et al. | |
| 2010/0237495 A1 | 9/2010 | Pagaila et al. | |
| 2010/0244208 A1 | 9/2010 | Pagaila et al. | |
| 2010/0314741 A1 | 12/2010 | Lee et al. | |
| 2011/0140259 A1 | 6/2011 | Cho et al. | |
| 2011/0215450 A1 | 9/2011 | Chi et al. | |
| 2011/0227208 A1 | 9/2011 | Kim et al. | |
| 2011/0278716 A1 | 11/2011 | Hsu et al. | |
| 2011/0291249 A1 | 12/2011 | Chi et al. | |

* cited by examiner

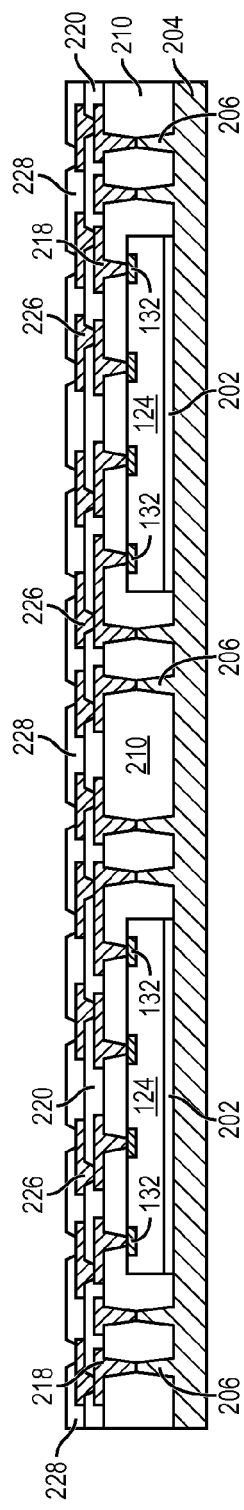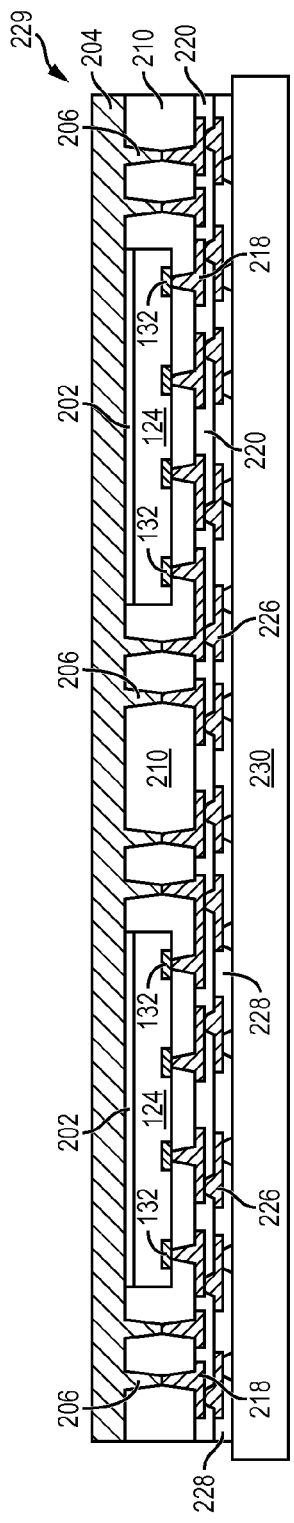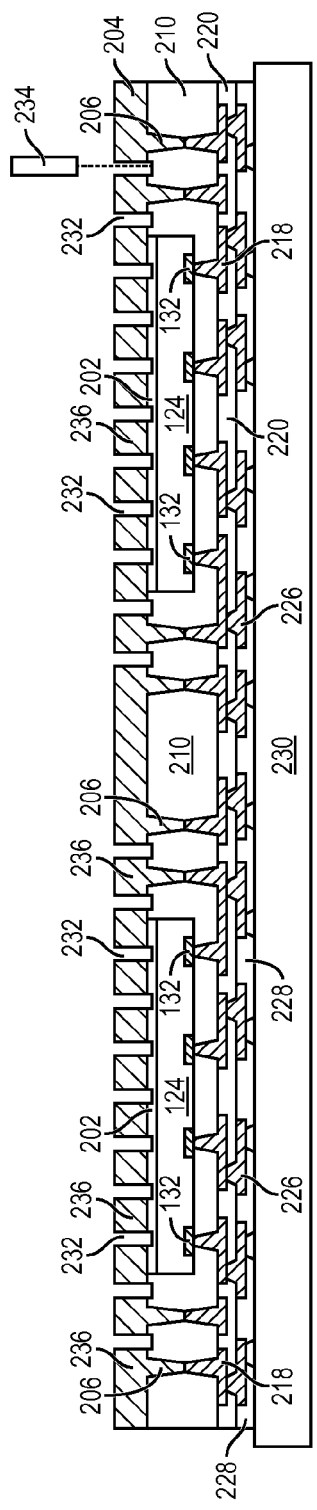

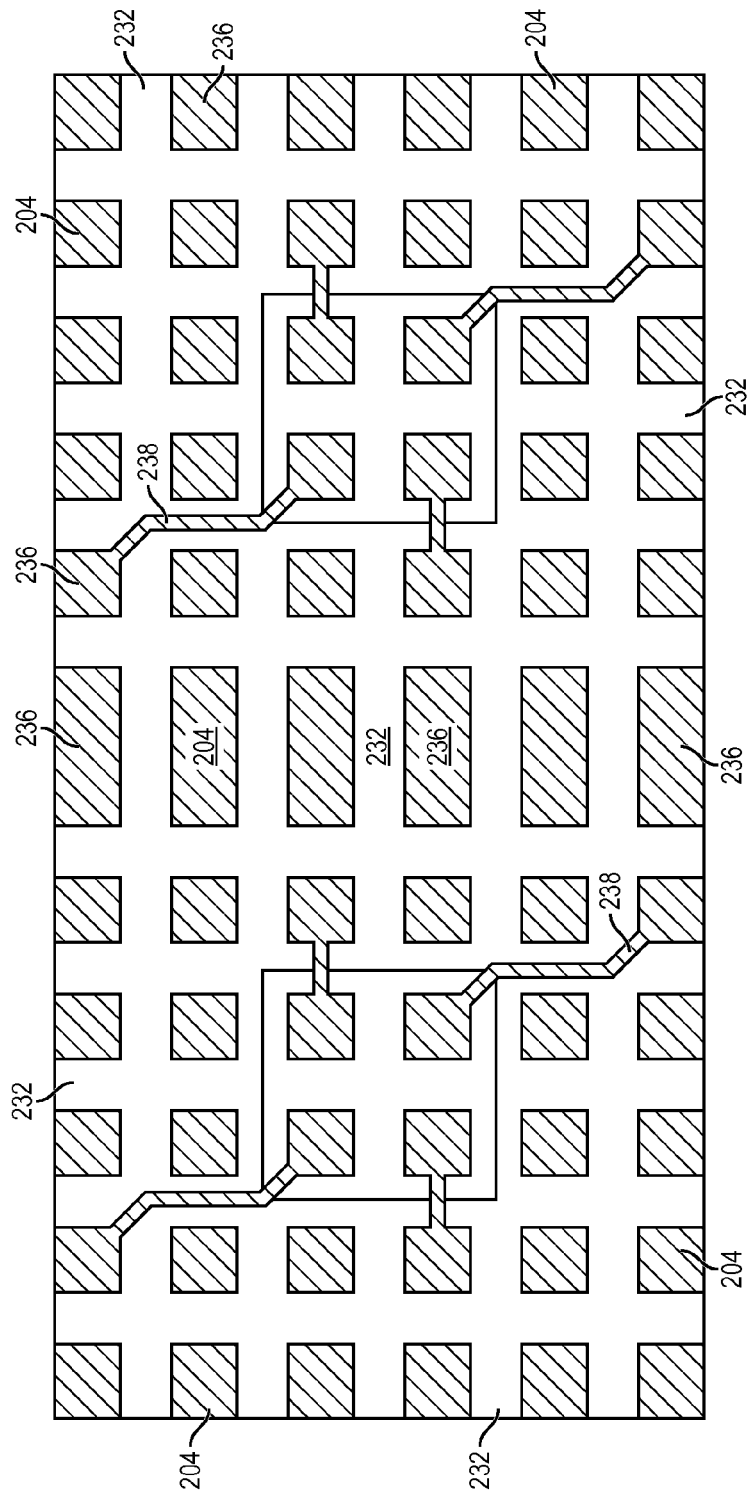
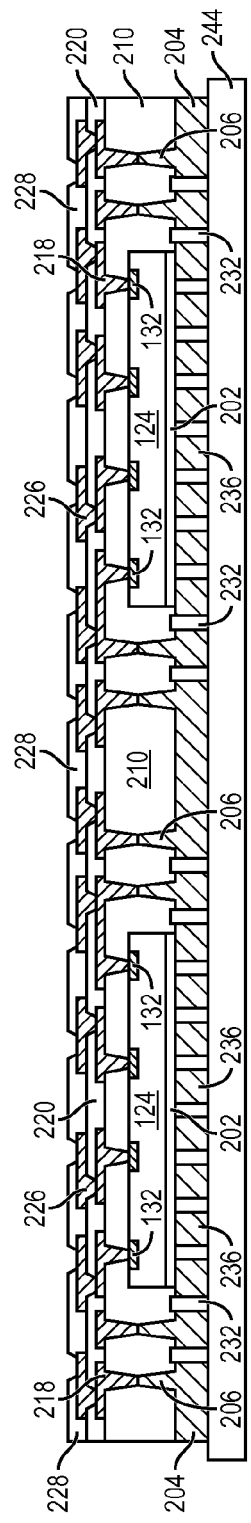
FIG. 6j
FIG. 6k

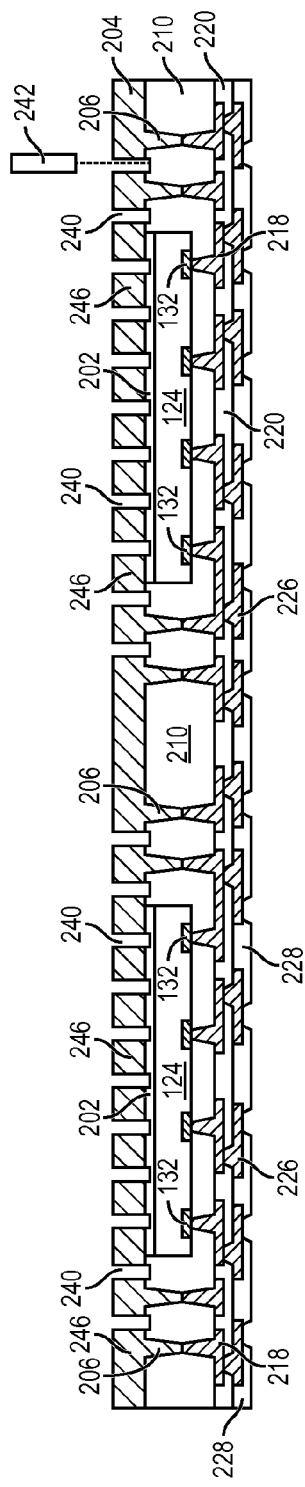
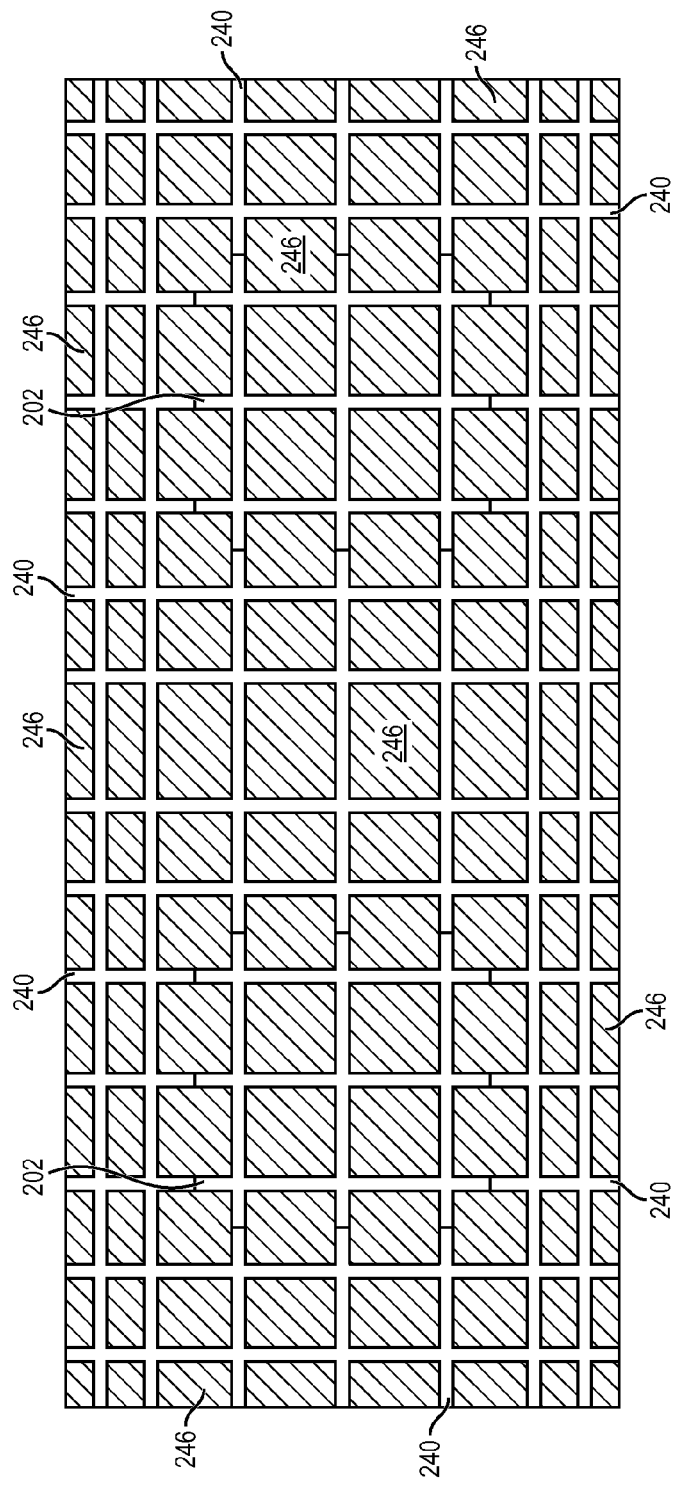
FIG. 7a
FIG. 7b

SEMICONDUCTOR DEVICE AND METHOD OF MAKING AN EMBEDDED WAFER LEVEL BALL GRID ARRAY (EWLB) PACKAGE ON PACKAGE (POP) DEVICE WITH A SLOTTED METAL CARRIER INTERPOSER

The present application is a continuation-in-part of U.S. patent application Ser. No. 13/683,946, filed Nov. 21, 2012, which is a continuation of U.S. patent application Ser. No. 12/787,973, now U.S. Pat. No. 8,349,658, filed May 26, 2010.

FIELD OF THE INVENTION

The present invention relates in general to semiconductor devices and, more particularly, to a semiconductor device and method of making an embedded wafer level ball-grid array (eWLB) package-on-package (PoP) device having a metal carrier interposer.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly, can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate or are susceptible to undesired electromagnetic interference (EMI) and radio frequency interference (RFI), harmonic distortion, or other inter-device interference, such as capacitive, inductive, or conductive coupling, also known as cross-talk, which can interfere with their operation.

Another goal of semiconductor manufacturing is to produce semiconductor devices with adequate heat dissipation. High frequency semiconductor devices generally generate more heat. Without effective heat dissipation, the generated heat can reduce performance, decrease reliability, and reduce the useful lifetime of the semiconductor device.

Semiconductor die often require a top and bottom build-up interconnect structure in a fan-out wafer level chip scale package (Fo-WLCSP) for electrical connection to external devices. The build-up interconnect structures are typically formed layer-by-layer on both sides of the Fo-WLCSP. The layer-by-layer formation of the build-up interconnect structures requires long cycle time and high manufacturing cost due to the industry standard temporary bonding processes. The temporary bonding can lower manufacturing yield and increase defects.

SUMMARY OF THE INVENTION

A need exists for a simple and cost-effective interconnect structure for eWLB PoP devices. Accordingly, in one embodiment, the present invention is a method of making a semiconductor device comprising the steps of providing a semiconductor die, disposing the semiconductor die over a conductive substrate, depositing an encapsulant over the semiconductor die, forming a first interconnect structure over the encapsulant, forming an opening through the substrate to isolate a portion of the substrate electrically connected to the first interconnect structure, and forming a bump over the first interconnect structure.

In another embodiment, the present invention is a method of making a semiconductor device comprising the steps of disposing a semiconductor die over a conductive substrate, depositing an encapsulant over the semiconductor die, forming a first interconnect structure over the encapsulant, and forming an opening through the substrate to isolate a portion of the substrate electrically connected to the first interconnect structure.

In another embodiment, the present invention is a method of making a semiconductor device comprising the steps of disposing a semiconductor die over a substrate, forming an interconnect structure over the semiconductor die, forming an opening in the substrate to isolate a portion of the substrate electrically connected to the interconnect structure, and forming a bump over the interconnect structure.

In another embodiment, the present invention is a semiconductor device comprising a conductive substrate. A semiconductor die is disposed over the substrate. An interconnect structure is formed over the substrate. Openings are formed in the substrate to separate a first portion of the substrate electrically connected to the interconnect structure.

BRIEF DESCRIPTION OF THE DRAWINGS

FIGS. 7a-7b illustrate a process of forming an eWLB device with a slotted interposer substrate and channels extending over a semiconductor die;

DETAILED DESCRIPTION OF THE DRAWINGS

Figure 1:
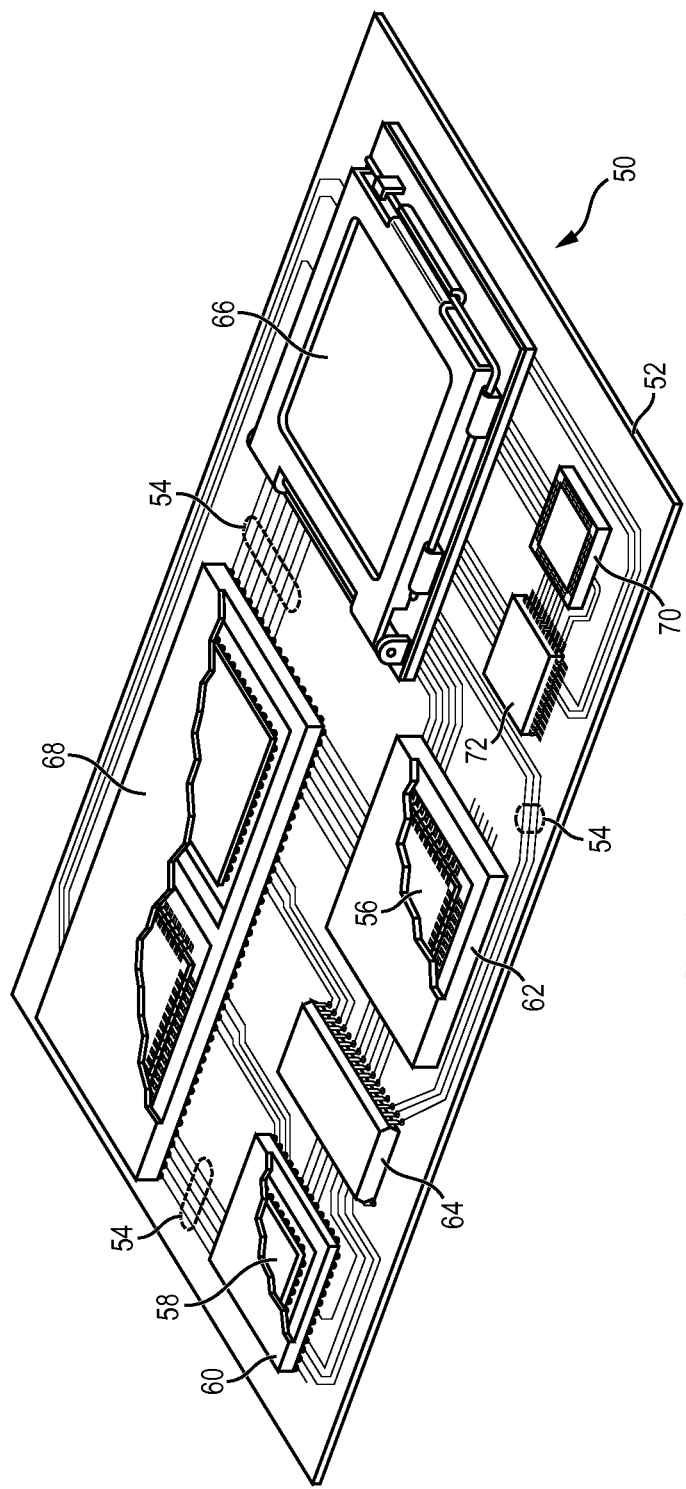
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisoprenes. Removing the soluble portions (i.e., the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photo-solubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e., the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for the products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
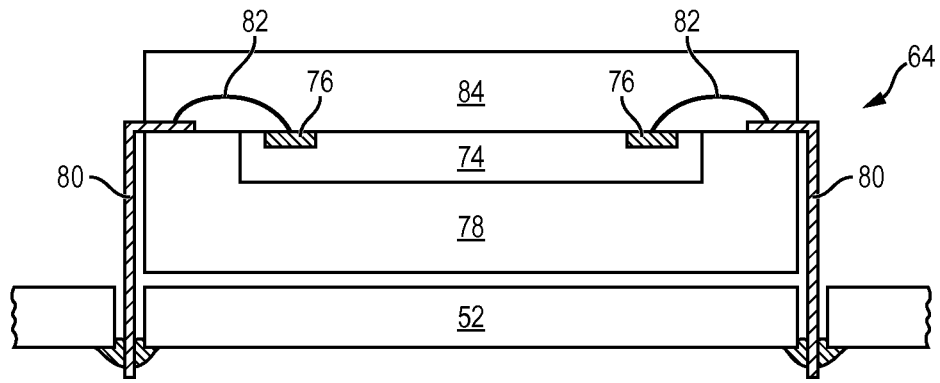
FIGS. 2a-2c illustrate further detail of the representative semiconductor packages mounted to the PCB.
Figure 2B:
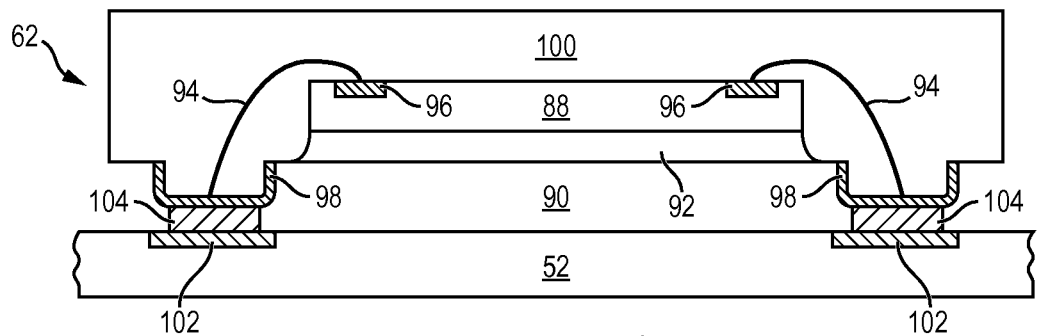
Figure 2C:
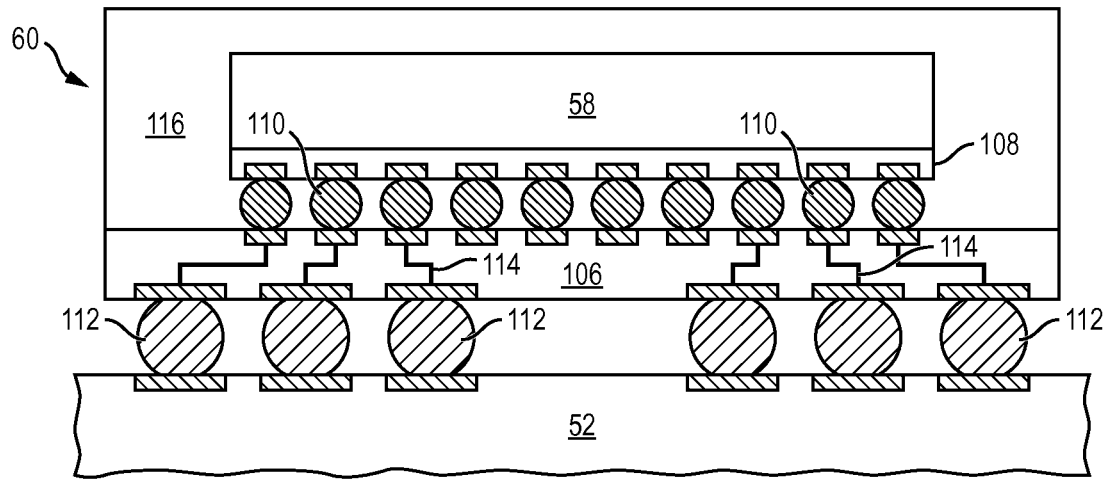

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulating packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
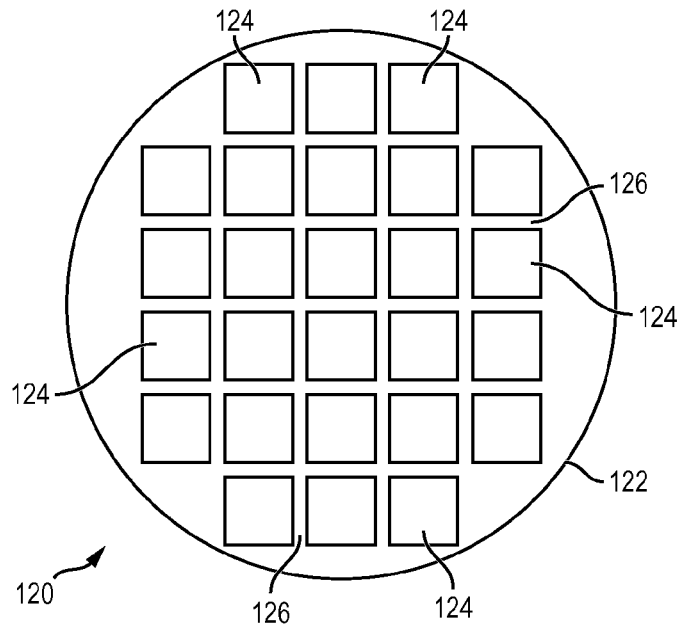
FIGS. 3a-3c illustrate a semiconductor wafer with a plurality of semiconductor die separated by a saw street.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
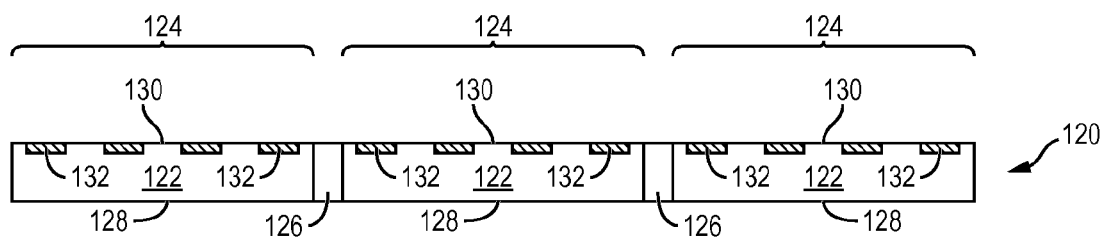

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing. In one embodiment, semiconductor die 124 is a flipchip type device.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Conductive layer 132 can be formed as contact pads disposed side-by-side a first distance from the edge of semiconductor die 124, as shown in FIG. 3b. Alternatively, conductive layer 132 can be formed as contact pads that are offset in multiple rows such that a first row of contact pads is disposed a first distance from the edge of the die, and a second row of contact pads alternating with the first row is disposed a second distance from the edge of the die.

Figure 3C:
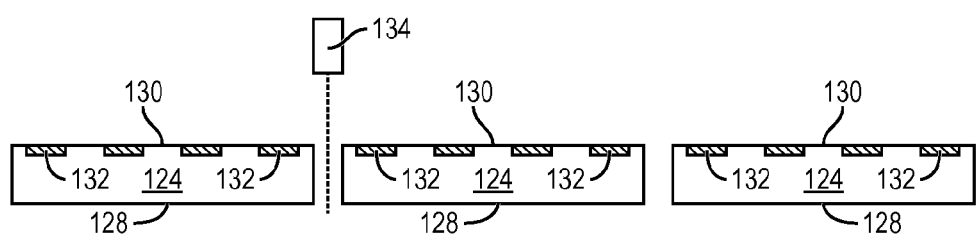

In FIG. 3c, semiconductor wafer 120 is singulated through saw street 126 using a saw blade or laser cutting tool 136 into individual semiconductor die 124.

Figure 4A:
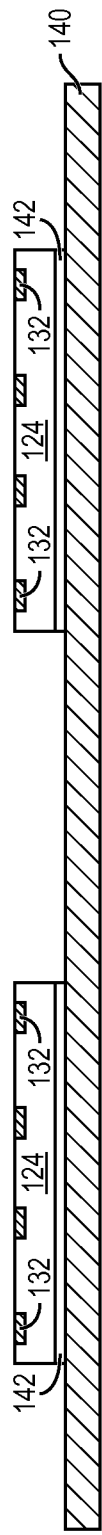
FIGS. 4a-4o illustrate a process of forming an eWLB device with a slotted interposer substrate and a semiconductor die mounted to the substrate.
Figure 4B:
Figure 4C:
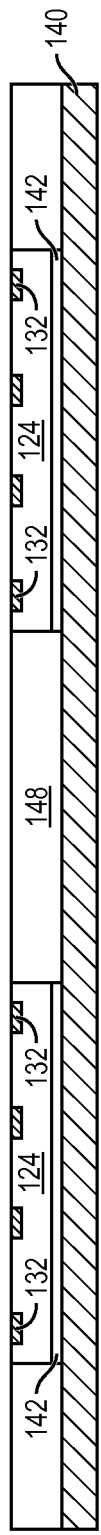
Figure 4D:
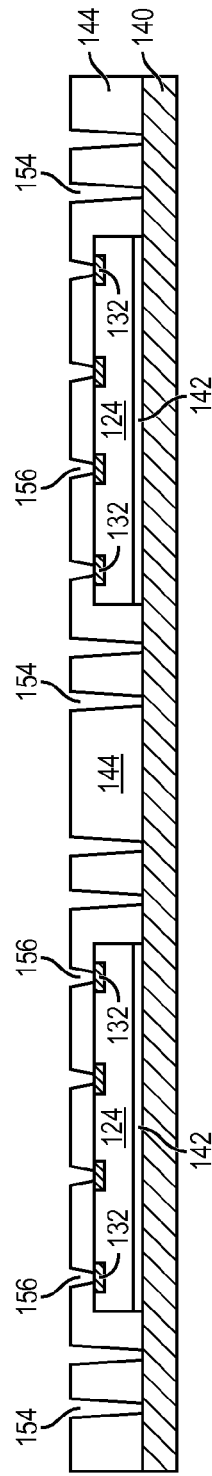
Figure 4E:
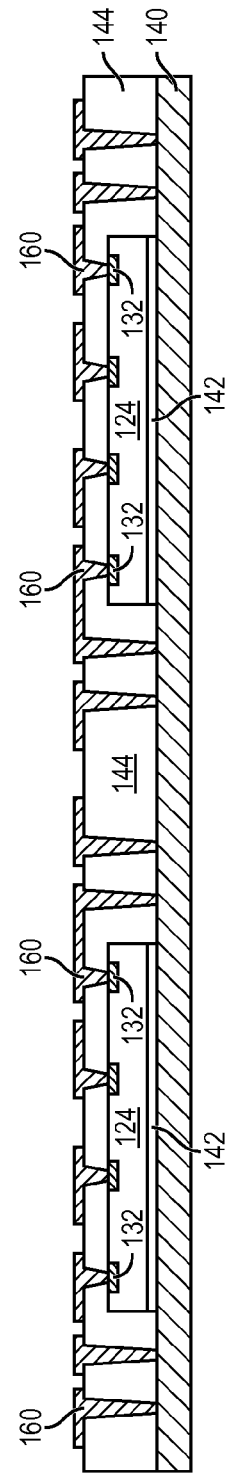
Figure 4F:
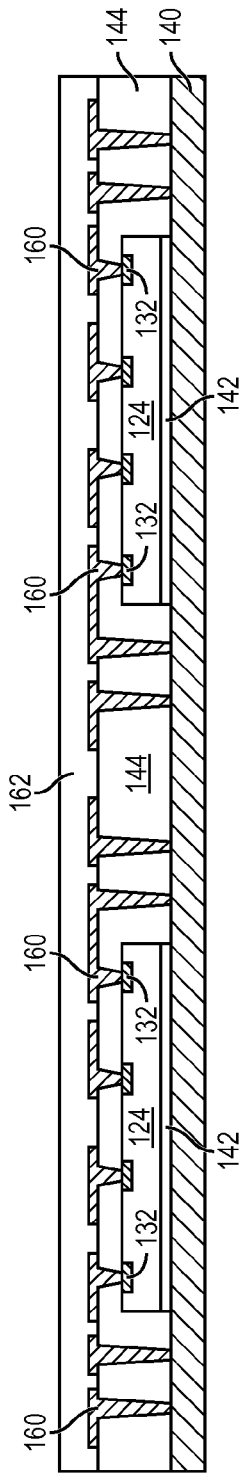
Figure 4G:
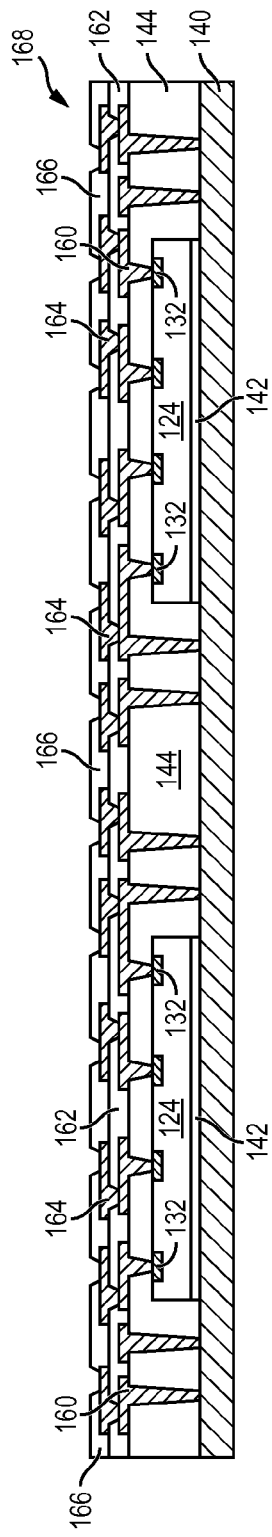
Figure 4H:
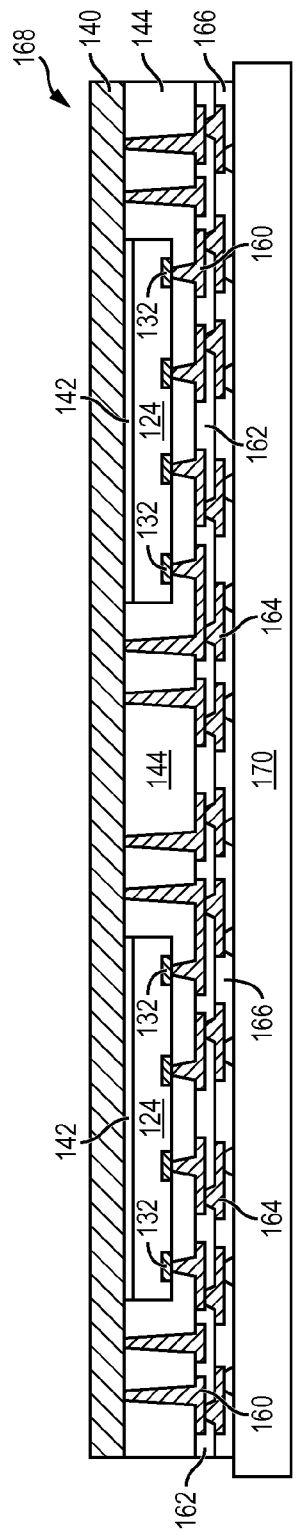
Figure 4I:
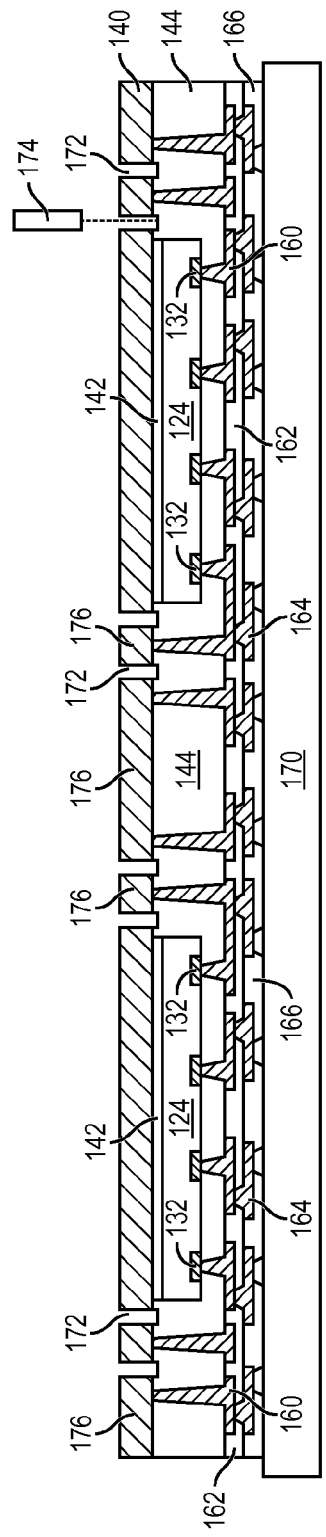
Figure 4J:
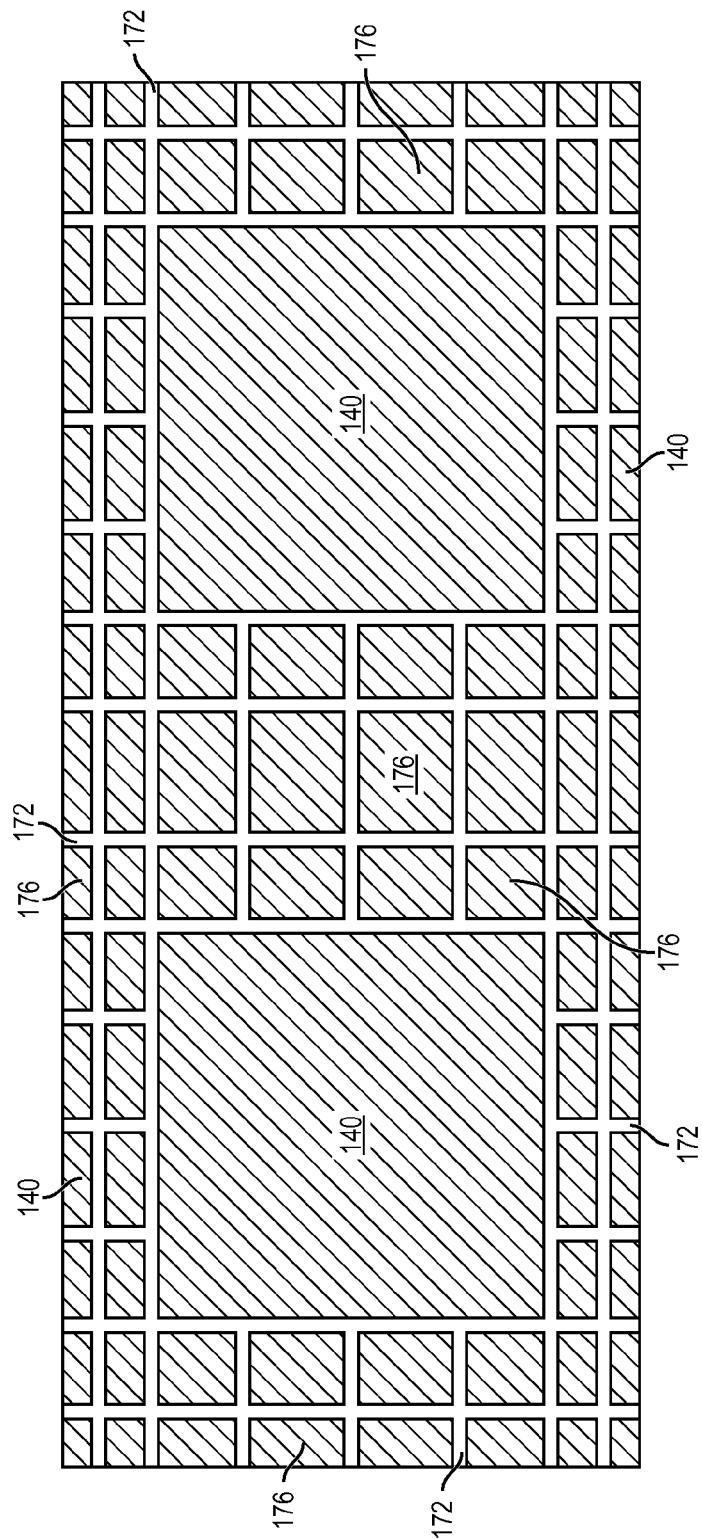
Figure 4K:
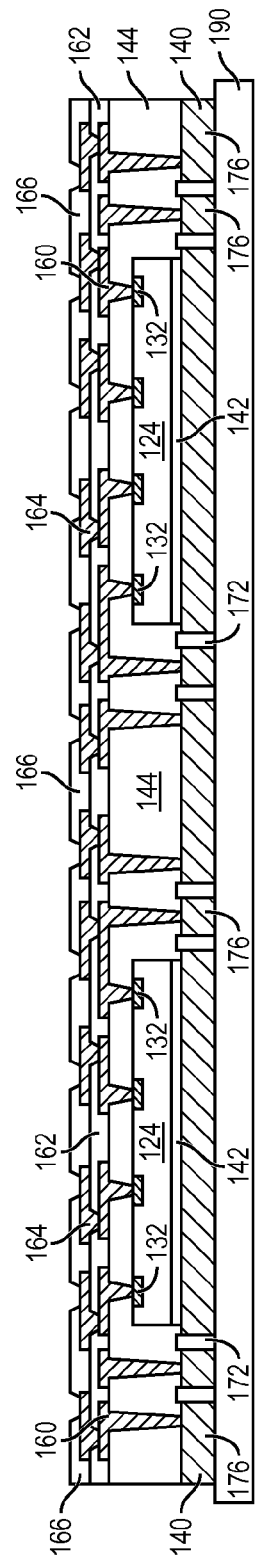
Figure 4L:
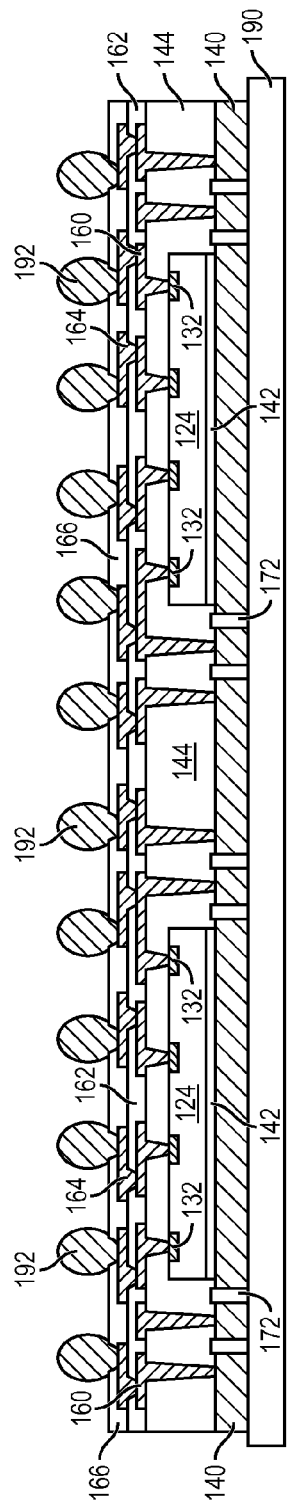
Figure 4M:
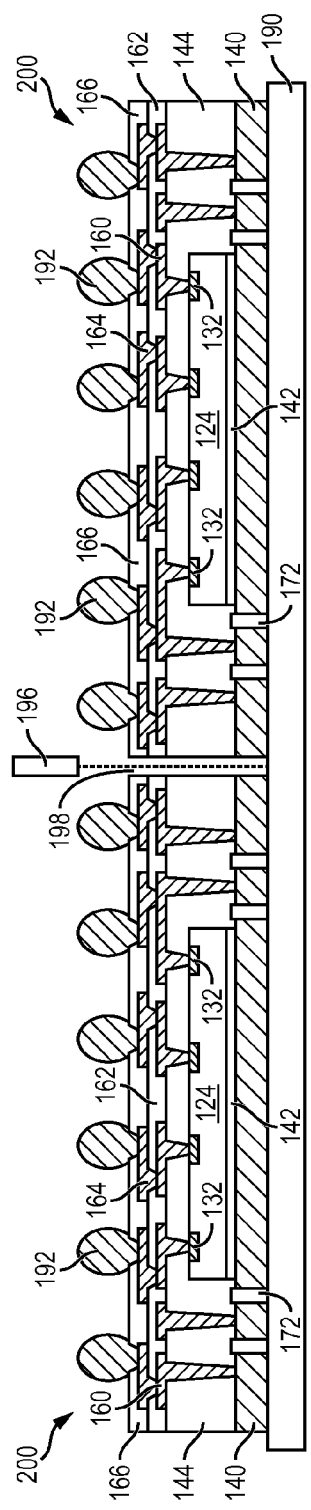
Figure 4O:
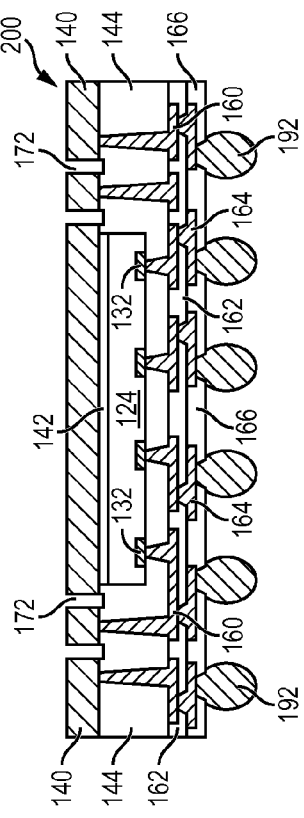

FIGS. 4a-4o illustrate a process of forming a slotted interposer substrate with a semiconductor die mounted to the substrate. FIG. 4a shows a substrate or carrier 140 containing conductive material such as Al, Cu, Sn, Ni, Au, Ag, Ti, W, or other suitable electrically conductive material for structural support. An interface layer or double-sided tape 142 is formed over substrate 140 as an adhesive bonding film, etch-stop layer, or release layer. Semiconductor die 124 from FIG. 3c are mounted to interface layer 142 and over substrate 140 using, for example, a pick and place operation with active surface 130 oriented away from substrate 140.

In FIG. 4b, an encapsulant or molding compound 144 is deposited over semiconductor die 124 and substrate 140 using a paste printing, compressive molding, transfer molding, liquid encapsulant molding, vacuum lamination, or other suitable applicator. Encapsulant 144 can be polymer composite material, such as epoxy resin with filler, epoxy acrylate with filler, or polymer with proper filler. Encapsulant 144 is non-conductive, provides physical support, and environmentally protects semiconductor die 124 from external elements and contaminants. Alternatively, encapsulant 144 includes epoxide resins, silica, cresol novolac epoxy, phenol novolac, antimony, bromide, or carbon. Alternatively, in FIG. 4c, encapsulant or molding compound 148 is deposited around semiconductor die 124 and over substrate 140, leaving active surface 130 of semiconductor die 124 exposed, using a paste printing, compressive molding, transfer molding, liquid encapsulant molding, vacuum lamination, film assisted mounding, or other suitable applicator.

Continuing from FIG. 4b, in FIG. 4d a plurality of through mold vias 154 is formed through encapsulant 144 and around die 124 using laser drilling, mechanical drilling, or deep reactive ion etching (DRIE). Another plurality of through mold vias 156 is formed through encapsulant 144 and over die 124 and contact pads 132 using laser drilling, mechanical drilling, or deep reactive ion etching (DRIE).

In FIG. 4e, vias 154 and 156 are filled with Al, Cu, Sn, Ni, Au, Ag, Ti, W, or other suitable electrically conductive material using patterning and metal deposition process such as printing, PVD, CVD, sputtering, electrolytic plating, electroless plating, or other suitable deposition process to form z-direction vertical interconnect conductive vias or conductive layer 160. Conductive vias 160 are electrically connected to substrate 140 and contact pads 132 of semiconductor die 124.

In FIG. 4f, an insulating or passivation layer 162 is formed over the upper surface of encapsulant 144 and conductive layer 160 using PVD, CVD, printing, spin coating, spray coating, slit coating, rolling coating, lamination, sintering, or thermal oxidation. Insulating layer 162 contains one or more layers of SiO2, Si3N4, SiON, Ta2O5, Al2O3, hafnium oxide (HfO2), benzocyclobutene (BCB), polyimide (PI), polybenzoxazoles (PBO), polymer dielectric resist with or without fillers or fibers, or other material having similar structural and dielectric properties.

In FIG. 4g, a build-up interconnect structure is formed over encapsulant 144 and semiconductor die 124. Build-up interconnect structure includes an electrically conductive layer or redistribution layer (RDL) 164 formed using a patterning and metal deposition process such as sputtering, electrolytic plating, and electroless plating. Conductive layer 164 can be one or more layers of Al, Cu, Sn, Ni, Au, Ag, or other suitable electrically conductive material. Conductive layer 164 is electrically connected to conductive layer 160 through an opening in insulating layer 162. Other portions of conductive layer 164 can be electrically common or electrically isolated depending on the design and function of semiconductor die 124. The build up interconnect structure also includes insulating layer 166 formed over a surface of insulating layer 162 and redistribution layer 164 using PVD, CVD, screen printing, spin coating, spray coating, sintering, or thermal oxidation. Insulating layer 166 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 166 is removed by laser direct ablation (LDA) or other suitable process to form openings over conductive layer 164.

In FIG. 4h, reconstituted wafer 168 is placed on an optional substrate or carrier 170. Substrate or carrier 170 contains temporary or sacrificial base material such as silicon, germanium, gallium arsenide, indium phosphide, silicon carbide, resin, or other suitable low-cost, rigid material for structural support. An interface layer or double-sided tape is formed over carrier 170 as a temporary adhesive bonding film or etch-stop layer. Reconstituted wafer 168 is mounted to the interface layer over carrier 170.

In FIG. 4i, a portion of back surface of substrate 140, opposite semiconductor die 124, is removed by laser direct ablation (LDA) to form channel 172 using laser cutting tool 174. Alternatively, channels 172 are formed using a saw blade or other suitable cutting device. Channels 172 are formed through substrate 140, into encapsulant 144, and outside a footprint of semiconductor die 124 to electrically isolate portion 176 of substrate 140 within channels 172. Portion 176 of substrate 140 isolated by channels 172 forms a contact pad electrically connected to conductive layer 164, conductive via 160, and semiconductor die 124. Portion 176 of substrate 140 can be any shape including square, round, triangular, or hexagonal. FIG. 4j illustrates a plan view of reconstituted wafer 168 with channels 172 around isolated portions 176 of substrate 140.

FIG. 4k illustrates reconstituted wafer 168 placed on optional carrier 190 for support. Substrate or carrier 190 contains temporary or sacrificial base material such as silicon, germanium, gallium arsenide, indium phosphide, silicon carbide, resin, or other suitable low-cost, rigid material for structural support. An interface layer or double-sided tape is formed over carrier 190 as a temporary adhesive bonding film or etch-stop layer. Reconstituted wafer 168 is mounted to the interface layer over carrier 190.

In FIG. 4l, an electrically conductive bump material 192 is deposited into openings of insulating layer 166 that expose conductive layer 164. Bumps 192 are electrically connected to conductive layer 164 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 164 using a suitable attachment or bonding process. In one embodiment, the bump material is reflowed by heating the material above its melting point to form balls or bumps 192. In some applications, bumps 192 are reflowed a second time to improve electrical contact to conductive layer 164. An under bump metallization (UBM) layer can be formed under bumps 192. Bumps 192 can also be compression bonded to conductive layer 164. Bumps 192 represent one type of interconnect structure that can be formed over conductive layer 164. The interconnect structure can also use bond wires, stud bump, micro bump, or other electrical interconnect.

Figure 4N:
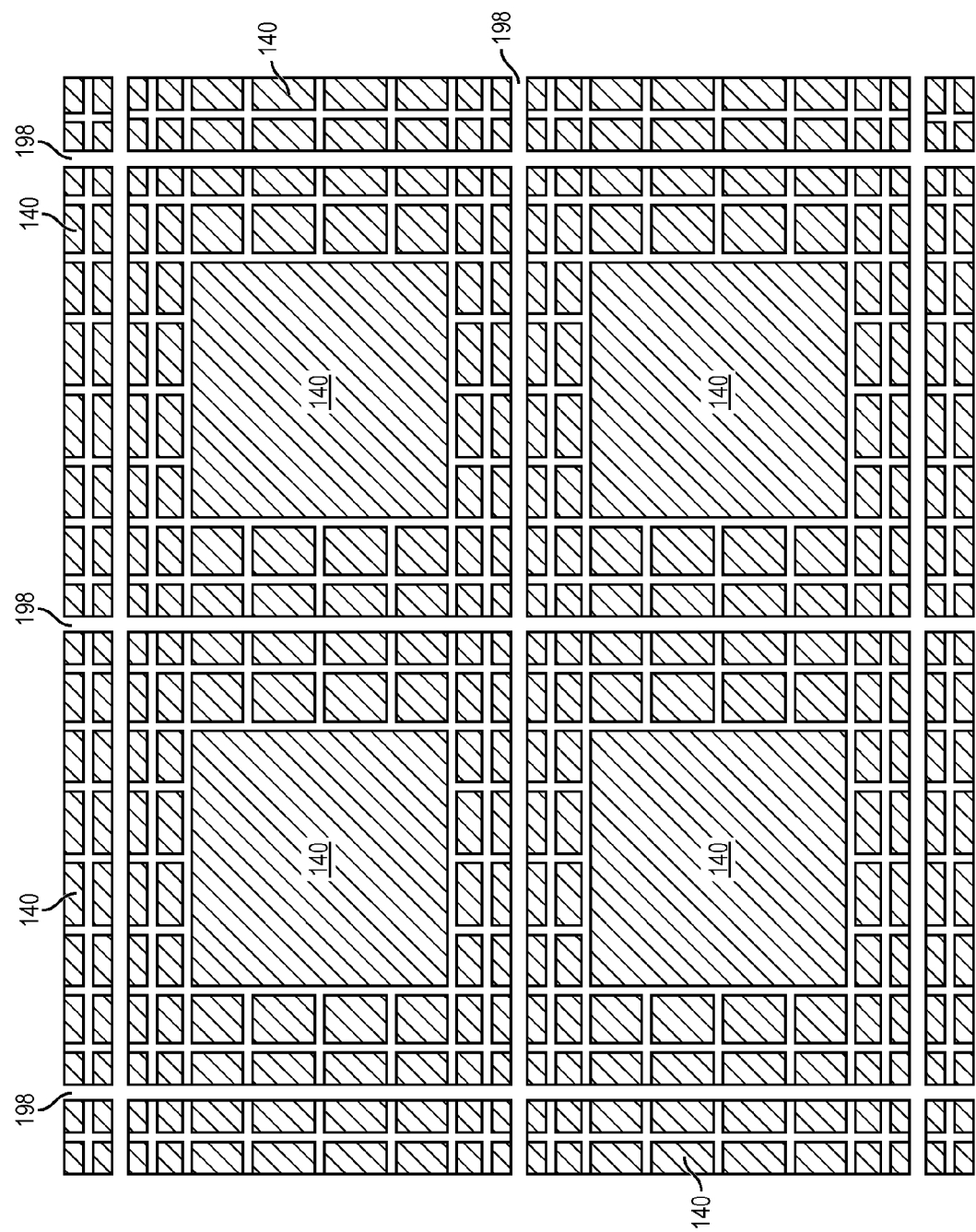

After the formation of bumps 192, substrate or reconstituted wafer 168 is singulated through encapsulant 144, insulating layer 162, and insulating layer 166 with saw blade or laser cutting device 196 to form opening 198 separating semiconductor devices 200 in FIG. 4m. Saw blade or laser cutting device 196 cuts an opening through a peripheral region around semiconductor die 124 to separate semiconductor devices 200. FIG. 4n illustrates a plan view of multiple semiconductor devices 200 separated by opening 198 after singulation.

FIG. 4o shows an individual semiconductor device 200 after singulation. The use of conductive substrate 140 to support the reconstituted wafer and form an electrical interconnect to contact pads 132 and conductive layer 160 provides improved heat dissipation through substrate 140. Semiconductor device 200 includes exposed conductive substrate 140 on a surface of semiconductor device 200 to improve warpage behavior. Conductive substrate 140 provides stable support for the wafer level processing of semiconductor device 200 without incurring the cost of bonding and debonding from the carrier and forming other interconnect structures over conductive layer 160. Additional packages are stacked on semiconductor device 200 and electrically connected to semiconductor device 200 through conductive substrate 140.

Figure 5A:
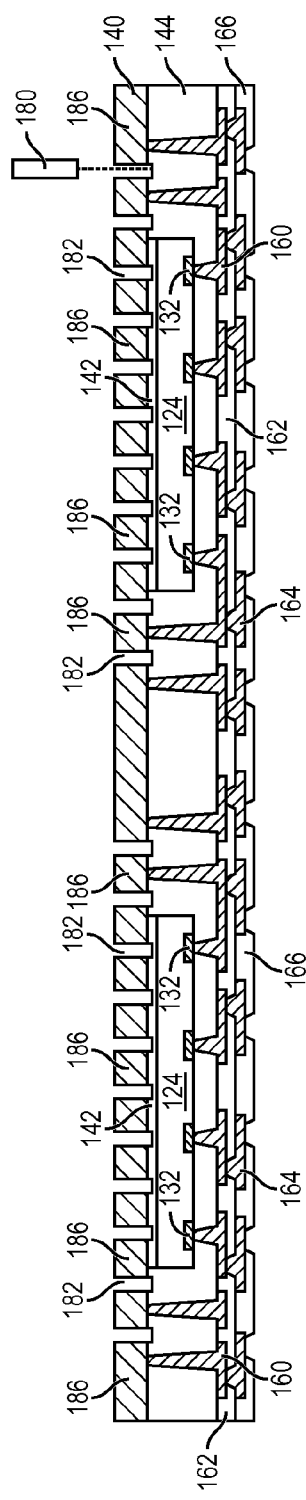
FIGS. 5a-5b illustrate a process of forming an eWLB device with a slotted interposer substrate and channels extending over a semiconductor die.
Figure 5B:
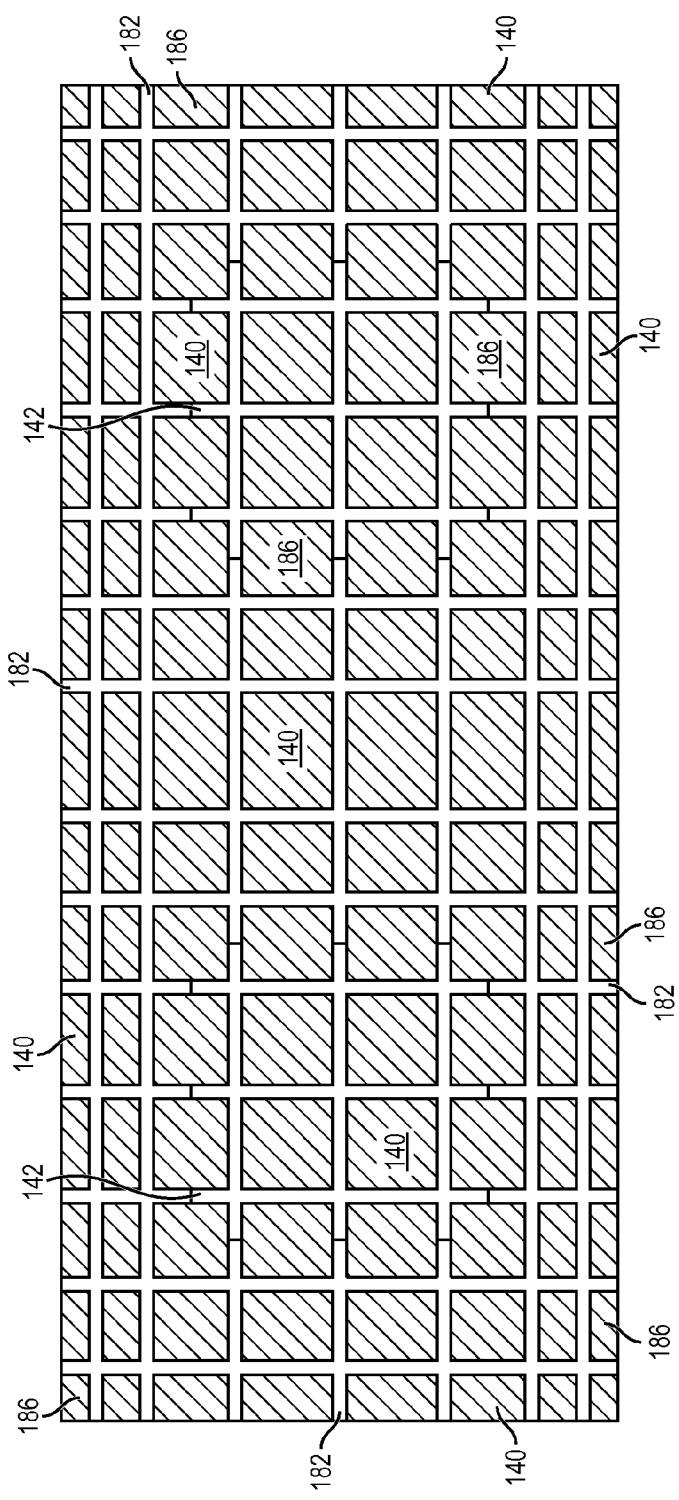

FIGS. 5a-5b illustrate a pattern of channels formed in a substrate with the channels extending over a semiconductor die. In FIG. 5a, a portion of back surface of substrate 140, opposite semiconductor die 124, is removed by a saw blade using cutting tool 180 to form channel 182. Alternatively, channels 182 are formed using laser direct ablation (LDA) or other suitable cutting device. Channels 182 are formed through substrate 140, into encapsulant 144, and extend over a footprint of semiconductor die 124 to electrically isolate portion 186 of substrate 140 within channels 182. Channels 182 intersect to surround portions 186 of substrate 140. Portion 186 of substrate 140 isolated by channels 182 forms a contact pad electrically connected to conductive layer 164, conductive via 160, and semiconductor die 124. Portion 186 of substrate 140 can be any shape including square, round, triangular, or hexagonal. FIG. 5b illustrates a plan view of reconstituted wafer 168 with channels 182 around isolated portions 186 of substrate 140.

Figure 6A:
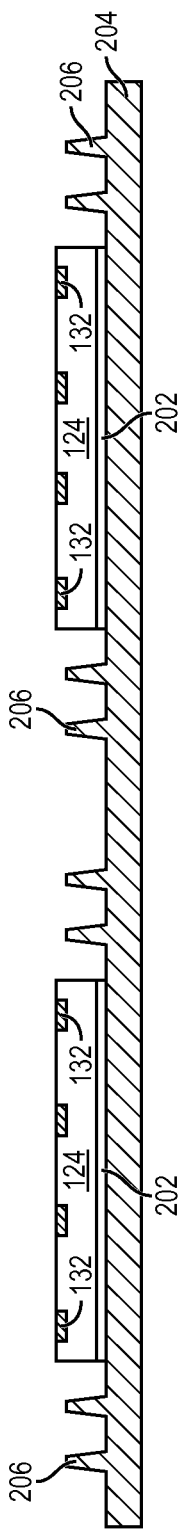
FIGS. 6a-6o illustrate a process of forming an eWLB device with a slotted interposer substrate including protrusions around a semiconductor die.

FIG. 6a shows a substrate or carrier 204 containing conductive material such as Al, Cu, Sn, Ni, Au, Ag, Ti, W, or other suitable electrically conductive material for structural support. Substrate 204 includes protrusions 206 extending above a surface of the substrate and around semiconductor die 124. The substrate is between 5 and 300 micrometers (μm) thick. In one embodiment, protrusions 206 have a height of 120 μm, die 120 has a height of 100 μm, and interface layer 202 has a height of 20 μm to enable plating with improved pitch. An interface layer or double-sided tape 202 is formed over substrate 204 as an adhesive bonding film, etch-stop layer, or release layer. Semiconductor die 124 from FIG. 3c are mounted to interface layer 202 and over substrate 204 using, for example, a pick and place operation with active surface 130 oriented away from substrate 204.

Figure 6B:
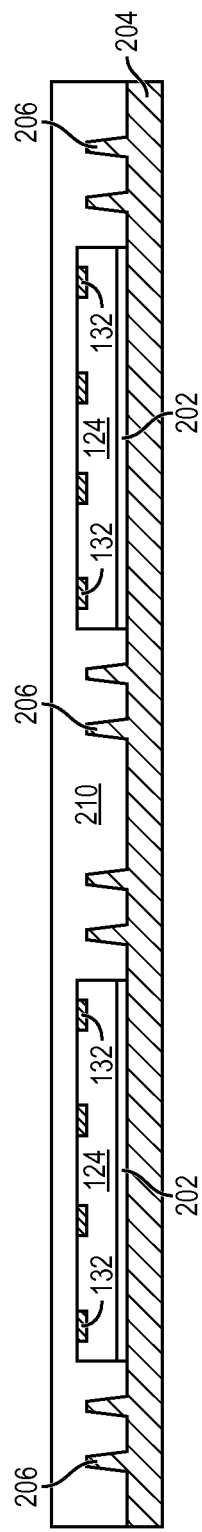
Figure 6C:
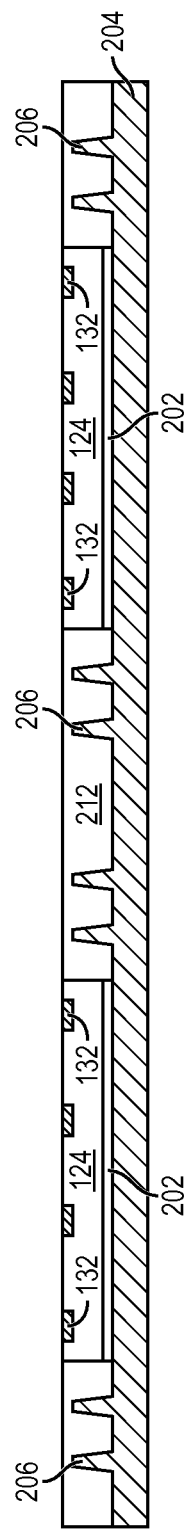

In FIG. 6b, an encapsulant or molding compound 210 is deposited over semiconductor die 124 and substrate 204 using a paste printing, compressive molding, transfer molding, liquid encapsulant molding, vacuum lamination, or other suitable applicator. Encapsulant 210 can be polymer composite material, such as epoxy resin with filler, epoxy acrylate with filler, or polymer with proper filler. Encapsulant 210 is non-conductive, provides physical support, and environmentally protects semiconductor die 124 from external elements and contaminants. Alternatively, encapsulant 210 includes epoxide resins, silica, cresol novolac epoxy, phenol novolac, antimony, bromide, or carbon. Alternatively, in FIG. 6c, encapsulant or molding compound 212 is deposited over substrate 204, leaving active surface 130 of semiconductor die 124 exposed, using a paste printing, compressive molding, transfer molding, liquid encapsulant molding, vacuum lamination, film assisted mounding, or other suitable applicator.

Figure 6D:
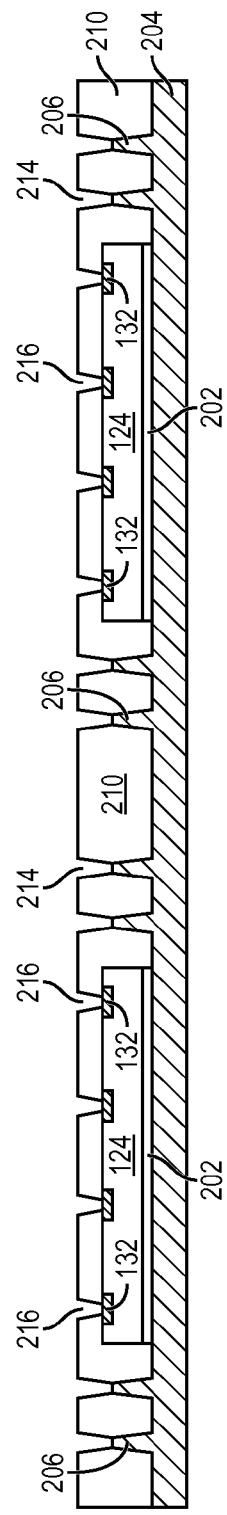

In FIG. 6d, a plurality of through mold vias 214 is formed through encapsulant 210 and around semiconductor die 124 to expose protrusion 206 using laser drilling, mechanical drilling, or deep reactive ion etching (DRIE). Another plurality of through mold vias 216 is formed through encapsulant 210 and over die 124 and contact pads 132 using laser drilling, mechanical drilling, or deep reactive ion etching (DRIE).

Figure 6E:
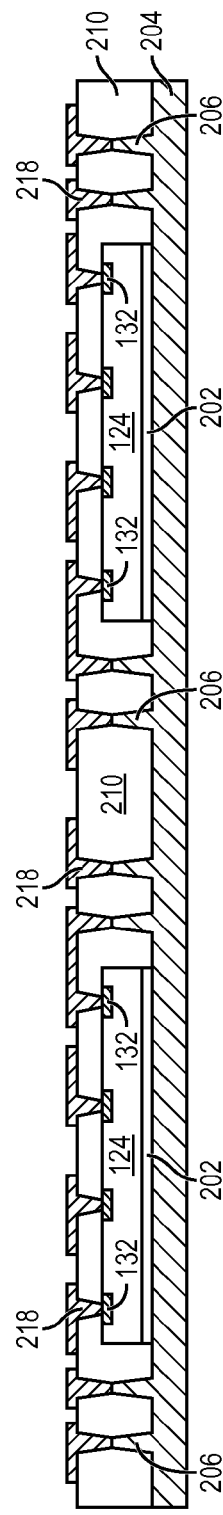

In FIG. 6e, vias 214 and 216 are filled with Al, Cu, Sn, Ni, Au, Ag, Ti, W, or other suitable electrically conductive material using patterning and metal deposition process such as printing, PVD, CVD, sputtering, electrolytic plating, electroless plating, or other suitable deposition process to form z-direction vertical interconnect conductive vias or conductive layer 218. Conductive vias 218 are electrically connected to substrate 204 and contact pads 132 of semiconductor die 124.

Figure 6F:
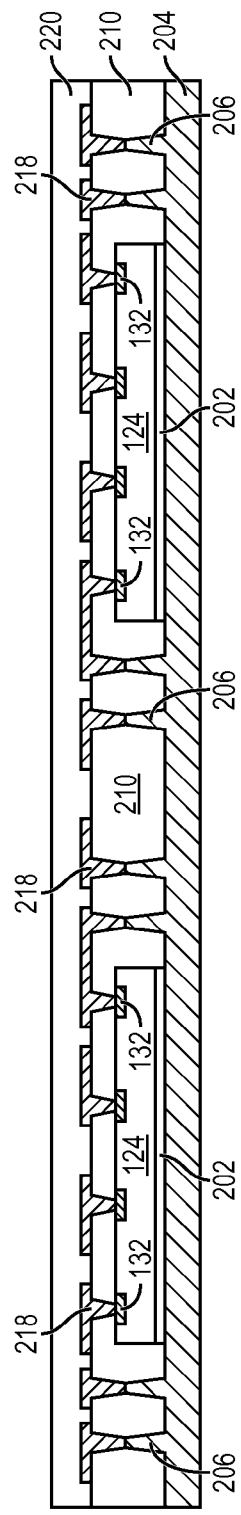

In FIG. 6f, an insulating or passivation layer 220 is formed over the upper surface of encapsulant 210 and conductive layer 218 using PVD, CVD, printing, spin coating, spray coating, slit coating, rolling coating, lamination, sintering, or thermal oxidation. Insulating layer 220 contains one or more layers of SiO2, Si3N4, SiON, Ta2O5, Al2O3, hafnium oxide (HfO2), benzocyclobutene (BCB), polyimide (PI), polybenzoxazoles (PBO), polymer dielectric resist with or without fillers or fibers, or other material having similar structural and dielectric properties.

In FIG. 6g, a build-up interconnect structure is formed over encapsulant 210 and insulating layer 228. Build-up interconnect structure includes an electrically conductive layer or redistribution layer (RDL) 226 formed using a patterning and metal deposition process such as sputtering, electrolytic plating, and electroless plating. Conductive layer 226 can be one or more layers of Al, Cu, Sn, Ni, Au, Ag, or other suitable electrically conductive material. Conductive layer 226 is electrically connected to conductive layer 218 through an opening in insulating layer 220. Other portions of conductive layer 226 can be electrically common or electrically isolated depending on the design and function of semiconductor die 124. The buildup interconnect structure also includes insulating layer 228 formed over a surface of insulating layer 220 and RDL 226 using PVD, CVD, screen printing, spin coating, spray coating, sintering, or thermal oxidation. Insulating layer 228 contains one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. A portion of insulating layer 228 is removed by laser direct ablation (LDA) or other suitable process to form openings over conductive layer 226.

In FIG. 6h reconstituted wafer 229 is placed on an optional substrate or carrier 230. Substrate or carrier 230 contains temporary or sacrificial base material such as silicon, germanium, gallium arsenide, indium phosphide, silicon carbide, resin, or other suitable low-cost, rigid material for structural support. An interface layer or double-sided tape is formed over carrier 230 as a temporary adhesive bonding film or etch-stop layer. Reconstituted wafer 229 is mounted to the interface layer over carrier 230.

In FIG. 6i, a portion of back surface of substrate 204, opposite semiconductor die 124, is removed by laser direct ablation (LDA) to form channel 232 using laser cutting tool 234. Alternatively, channels 232 are formed using a saw blade or other suitable cutting device. Channels 232 are formed through substrate 204, into encapsulant 210, and outside a footprint of semiconductor die 124 to electrically isolate portions 236 of substrate 204 within channels 232. Portion 236 of substrate 204 isolated by channels 232 forms a contact pad electrically connected to conductive layer 226, conductive via 218, and semiconductor die 124. Portion 236 of substrate 204 can be any shape including square, round, triangular, or hexagonal. FIG. 6j illustrates a plan view of reconstituted wafer 229 with channels 232 around isolated portions 236 of substrate 204. Some portions 236 of substrate 204 remain electrically connected by another portion of substrate 204 forming leads 238.

FIG. 6k illustrates reconstituted wafer 229 placed on optional carrier 250 for support. Substrate or carrier 250 contains temporary or sacrificial base material such as silicon, germanium, gallium arsenide, indium phosphide, silicon carbide, resin, or other suitable low-cost, rigid material for structural support. An interface layer or double-sided tape is formed over carrier 250 as a temporary adhesive bonding film or etch-stop layer. Reconstituted wafer 229 is mounted to the interface layer over carrier 250.

Figure 6L:
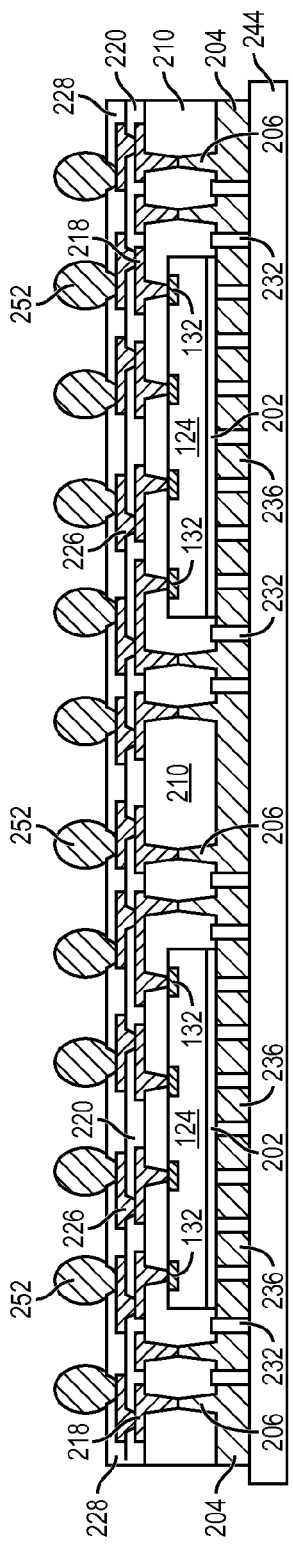

In FIG. 6l, an electrically conductive bump material 252 is deposited into openings of insulating layer 228 that expose conductive layer 226. Bumps 252 are electrically connected to conductive layer 226 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 226 using a suitable attachment or bonding process. In one embodiment, the bump material is reflowed by heating the material above its melting point to form balls or bumps 252. In some applications, bumps 252 are reflowed a second time to improve electrical contact to conductive layer 226. An under bump metallization (UBM) layer can be formed under bumps 252. Bumps 252 can also be compression bonded to conductive layer 226. Bumps 252 represent one type of interconnect structure that can be formed over conductive layer 226. The interconnect structure can also use bond wires, stud bump, micro bump, or other electrical interconnect.

Figure 6M:
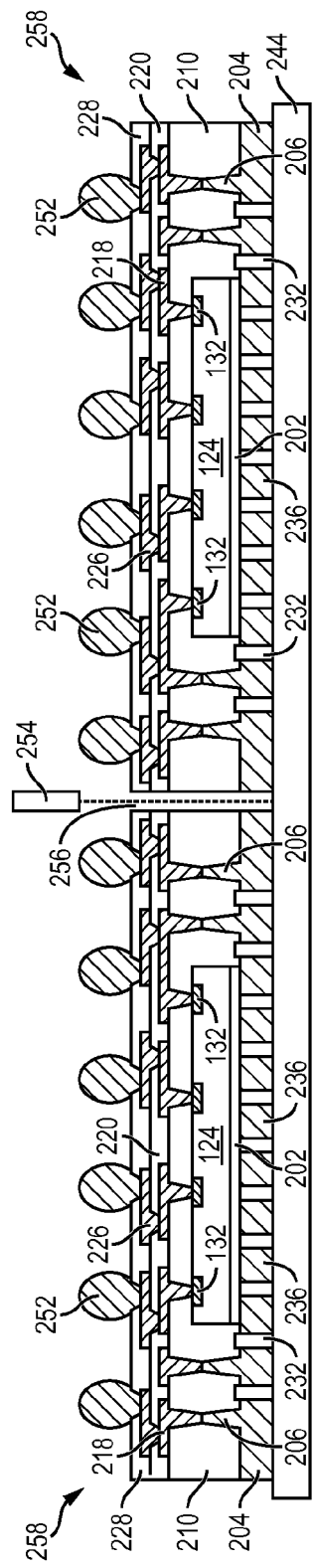

After the formation of bumps 252, substrate or reconstituted wafer 229 is singulated through encapsulant 210, insulating layer 220, and insulating layer 228 with saw blade or laser cutting device 254 to form opening 256 separating semiconductor devices 258 in FIG. 6m. Saw blade or laser cutting device 254 cuts an opening through a peripheral region around semiconductor die 124 so that semiconductor devices 258 are separated. FIG. 6n illustrates a plan view of multiple semiconductor devices 258 separated by opening 256 after singulation.

Figure 6O:
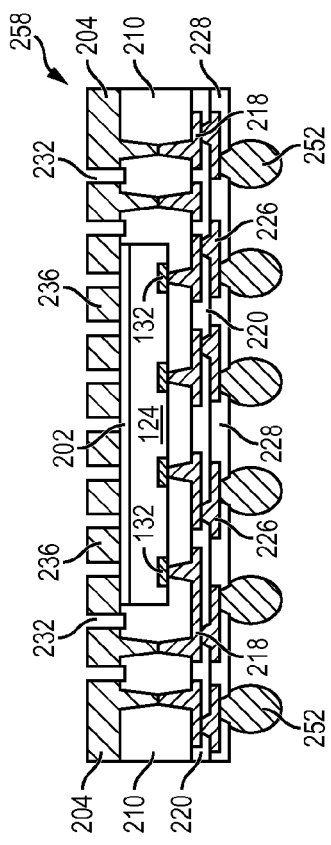
Figure 6N:
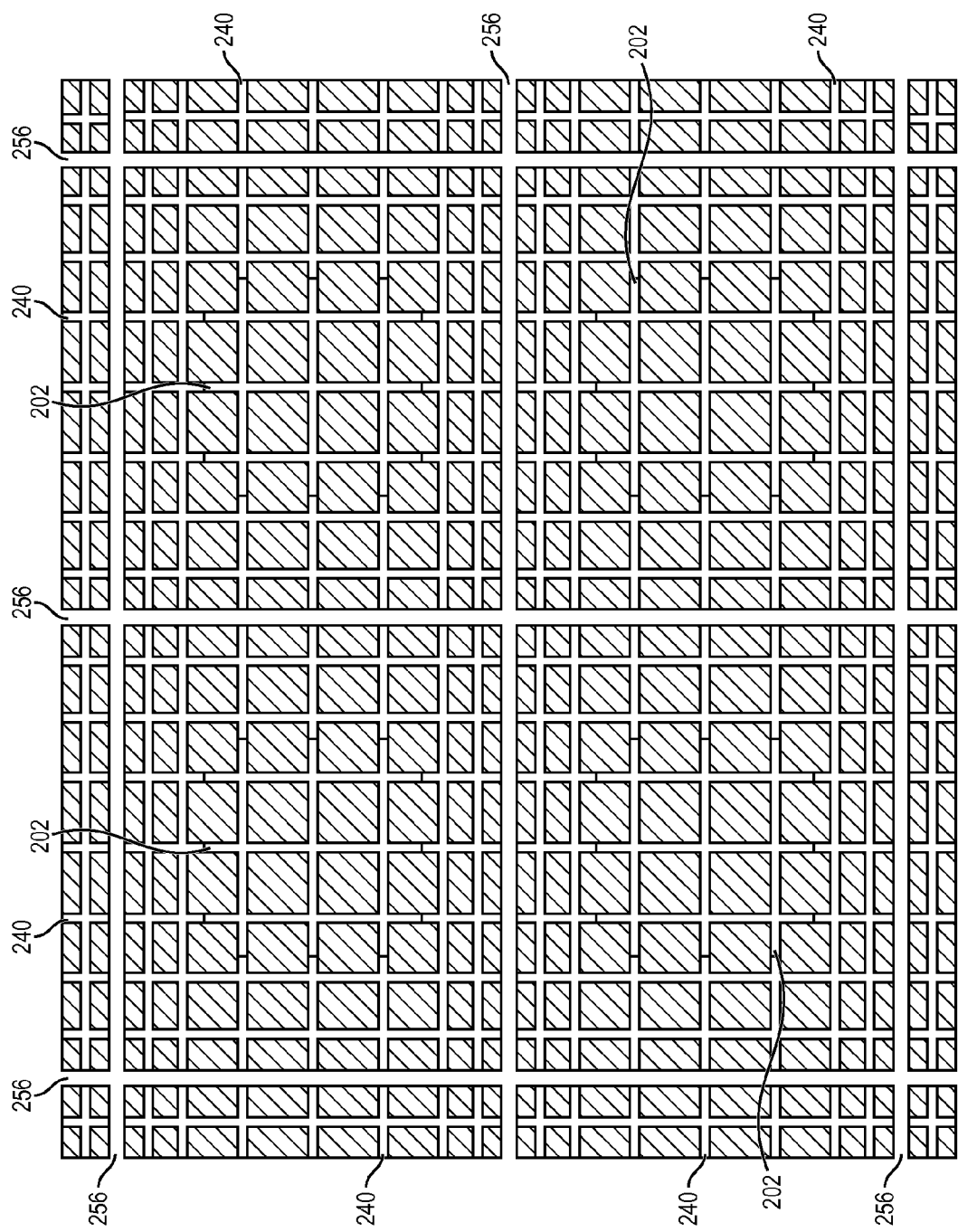

FIG. 6o shows an individual semiconductor device 258 after singulation. The use of conductive substrate 204 to support the reconstituted wafer and form an electrical interconnect to contact pads 132 and conductive layer 218 provides improved heat dissipation through substrate 204. Semiconductor device 258 includes exposed conductive substrate 204 on a surface of semiconductor device 258 to improve warpage behavior. Conductive substrate 204 provides stable support for the wafer level processing of semiconductor device 258 without incurring the cost of bonding and debonding from the carrier and forming other interconnect structures over conductive layer 218.

FIGS. 7a-7b show a process of forming an eWLB device with a slotted interposer substrate and channels extending over a semiconductor die. In FIG. 7a, a portion of back surface of substrate 204, opposite semiconductor die 124, is removed by laser direct ablation (LDA) to form channel 240 using laser cutting tool 242. Alternatively, channels 240 are formed using a saw blade or other suitable cutting device. Channels 240 are formed through substrate 204, into encapsulant 210, and extend over a footprint of semiconductor die 124 to electrically isolate portion 246 of substrate 204 within channels 240. Portion 246 of substrate 204 isolated by channels 240 forms a contact pad electrically connected to conductive layer 226, conductive via 218, and semiconductor die 124. Portion 246 of substrate 204 can be any shape including square, round, triangular, or hexagonal. FIG. 7b illustrates a plan view of reconstituted wafer 229 with channels 240 around isolated portions 246 of substrate 204 and extending over the footprint of semiconductor die 124.

Figure 8:
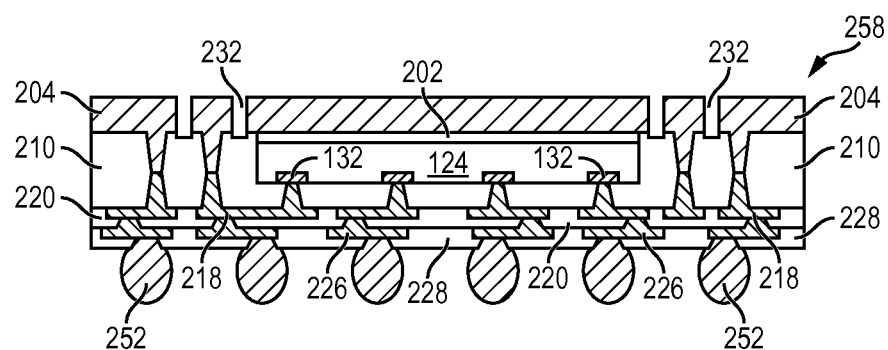
FIG. 8 illustrates an eWLB device with a slotted interposer substrate and channels formed outside a footprint of a semiconductor die.

FIG. 8 illustrates an eWLB PoP device with a slotted interposer substrate and channels formed outside a footprint of a semiconductor die, similar to semiconductor device 200 in FIG. 4o. The use of conductive substrate 204 to support the reconstituted wafer and form an electrical interconnect to contact pads 132 and conductive layer 218 provides improved heat dissipation through substrate 204. Semiconductor device 258 includes exposed conductive substrate 204 on a surface of semiconductor device 258 to improve warpage behavior. Conductive substrate 204 provides stable support for the wafer level processing of semiconductor device 258 without incurring the cost of bonding and debonding from the carrier and forming other interconnect structures over conductive layer 218.

Figure 9A:
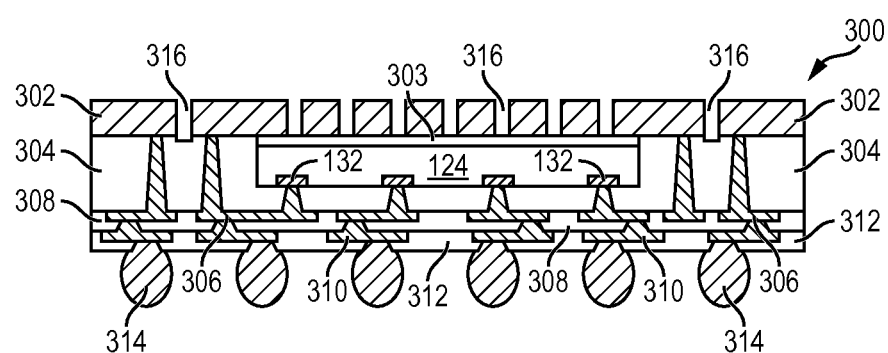
FIGS. 9a-9c illustrate process of forming an eWLB device with a slotted interposer substrate and a semiconductor die mounted to the substrate.
Figure 9B:
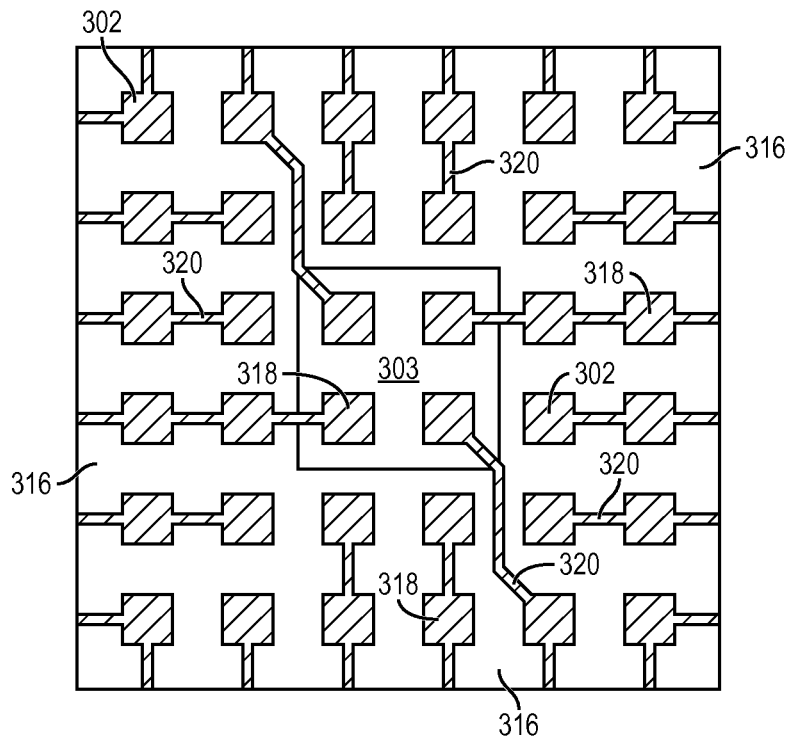
Figure 9C:
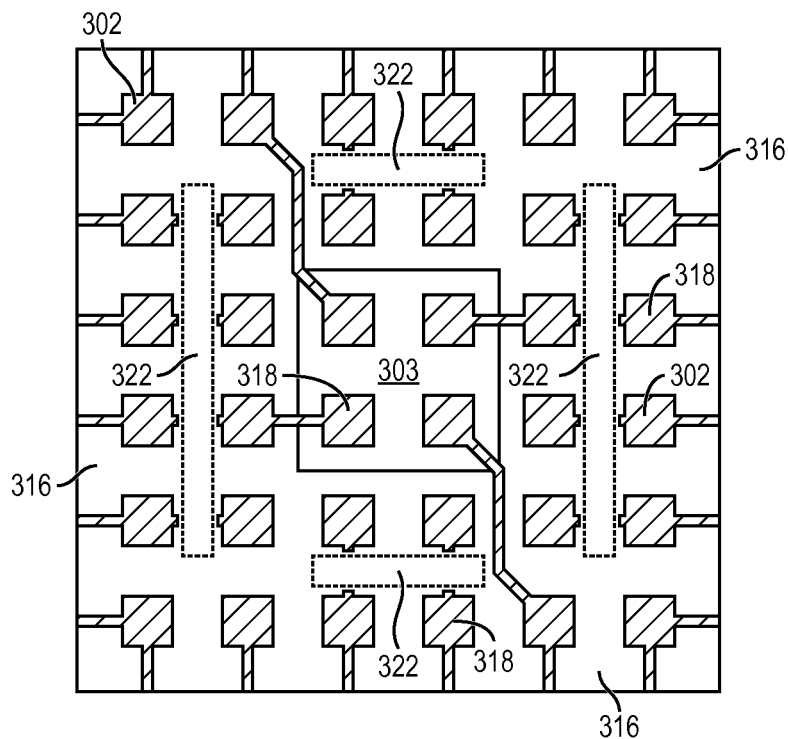

FIGS. 9a-9c illustrate an eWLB PoP, similar to semiconductor device 200 in FIG. 4o, formed using a leadframe. FIG. 9a illustrates semiconductor device 300 including leadframe 302. Leadframe 302 provides support during the formation of semiconductor device 300. Semiconductor die 124 is disposed over leadframe 302 with encapsulant 304 deposited over semiconductor die 124 and leadframe 302. Conductive vias 306 are formed through encapsulant 304 to electrically connect to leadframe 302 and contact pads 132. Insulating layer 308 is formed over conductive layer 306 and encapsulant 304. Conductive layer 310 is formed over insulating layer 308 and electrically connected to conductive via 306. Insulating layer 312 is formed over conductive layer 310 with openings exposing conductive layer 310. Bumps 314 are electrically connected to conductive layer 310 through openings in insulating layer 312. Channels 316 in leadframe 302 electrically isolate portions of leadframe 302 to provide electrical interconnection to conductive layer 306. FIG. 9b illustrates a plan view of semiconductor device 300 with leadframe 302 before isolating portions 318 of the leadframe by removing of portions 322 of the leadframe to form channels. In FIG. 9c, portions 322 of leadframe 302 are removed to electrically isolate remaining portions 318 of leadframe.

The use of leadframe 302 to support the reconstituted wafer and form an electrical interconnect to contact pads 132 and conductive layer 310 provides improved heat dissipation through leadframe 302. Semiconductor device 300 includes exposed leadframe 302 on a surface of semiconductor device 300 to improve warpage behavior. Leadframe 302 provides stable support for the wafer level processing of semiconductor device 300 without incurring the cost of bonding and debonding from a carrier and forming other interconnect structures over conductive layer 310.

Figure 10:
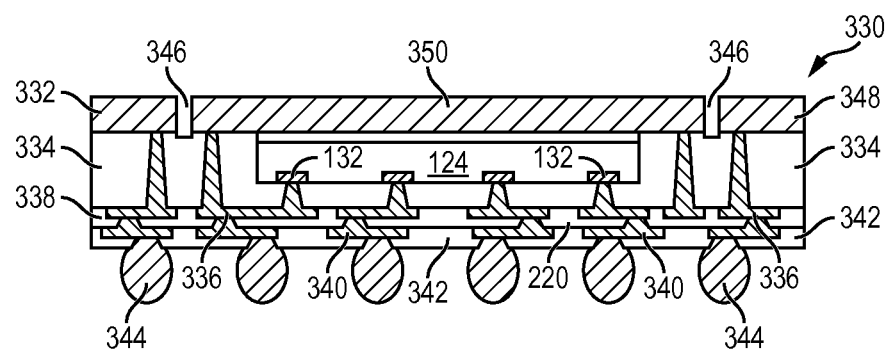
FIG. 10 illustrates an eWLB device with a slotted interposer substrate configured to act as an EMI shield over a semiconductor die.

FIG. 10 illustrates an eWLB PoP device, similar to semiconductor device 200 in FIG. 4o, with a slotted interposer substrate configured to act as an EMI shield over a semiconductor die. Semiconductor device 330 includes conductive substrate 332. Conductive substrate 332 provides support during the formation of semiconductor device 330. Semiconductor die 124 is disposed over conductive substrate 332 with encapsulant 334 deposited over semiconductor die 124 and substrate 332. Conductive vias 336 are formed through encapsulant 334 to electrically connect to conductive substrate 332 and contact pads 132. Insulating layer 338 is formed over conductive layer 336 and encapsulant 334. Conductive layer 340 is formed over insulating layer 338 and electrically connected to substrate 332. Insulating layer 342 is formed over conductive layer 340 and electrically connected to bumps 344. Channels 346 in conductive substrate 332 electrically isolate portions 348 of conductive substrate 332 to provide electrical interconnection to conductive layer 336. Channels 346 in conductive substrate 332 also electrically isolate portions 350 of conductive substrate 332 to provide an EMI shield over semiconductor die 124.

Figure 11:
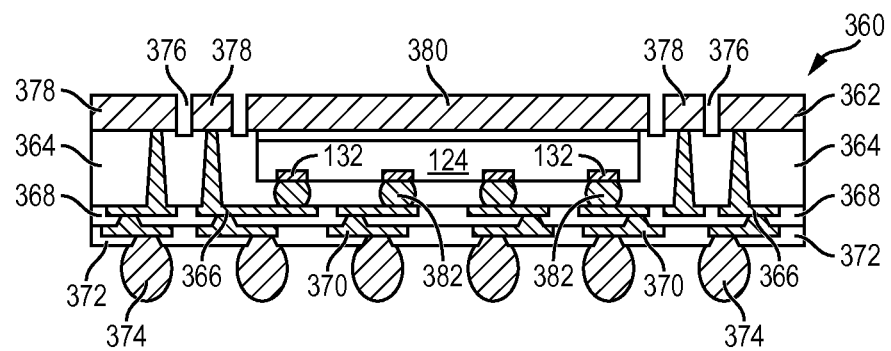
FIG. 11 illustrates an eWLB device with a slotted interposer substrate and a bumped semiconductor die mounted to the substrate.

FIG. 11 illustrates an eWLB PoP device, similar to semiconductor device 200 in FIG. 4o, depicted as semiconductor device 360 including conductive substrate 362. Conductive substrate 362 provides support during the formation of semiconductor device 360. Semiconductor die 124 is disposed over conductive substrate 362 with encapsulant 364 deposited over semiconductor die 124 and substrate 362. Conductive vias 366 are formed through encapsulant 364 to electrically connect to conductive substrate 362 and contact pads 132. Insulating layer 368 is formed over conductive layer 366 and encapsulant 364. Conductive layer 370 is formed over insulating layer 368 and electrically connected to substrate 362. Insulating layer 372 is formed over conductive layer 370 and electrically connected to bumps 374. Channels 376 in conductive substrate 362 electrically isolate portions 378 of conductive substrate 362 to provide electrical interconnection to conductive layer 366. Portion 380 of conductive substrate 362 over semiconductor die 124 provides structural support, improved heat dissipation, and improved warpage behavior.

An electrically conductive bump material is deposited over contact pads 132 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 132 using a suitable attachment or bonding process. In one embodiment, the bump material is reflowed by heating the material above its melting point to form balls or bumps 382. In some applications, bumps 382 are reflowed a second time to improve electrical contact to contact pads 132. Bumps 382 can also be compression bonded or thermocompression bonded to contact pads 132. Bumps 382 represent one type of interconnect structure that can be formed over contact pads 132. The interconnect structure can also use stud bump, micro bump, or other electrical interconnect.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor device, comprising:
    providing a conductive substrate;
    disposing a semiconductor die over the conductive substrate;
    depositing an encapsulant over the semiconductor die;
    forming an interconnect structure over the encapsulant; and
    forming an opening through the conductive substrate and a portion of the encapsulant to isolate a portion of the conductive substrate electrically connected to the interconnect structure.

2. The method of claim 1, further including forming a plurality of conductive vias through the encapsulant.

3. The method of claim 1, wherein forming the opening creates a plurality of contact pads electrically connected to the interconnect structure.

4. The method of claim 1, further including depositing the encapsulant coplanar with a surface of the semiconductor die.

5. The method of claim 1, further including:
    providing the conductive substrate to include a protrusion extending above a surface of the conductive substrate; and
    forming a conductive via extending through the encapsulant to the protrusion.

6. A method of making a semiconductor device, comprising:
    providing a conductive substrate;
    disposing a semiconductor die over the conductive substrate;
    depositing an encapsulant over the semiconductor die; and
    forming a trench through the conductive substrate after depositing the encapsulant.

7. The method of claim 6, further including forming a conductive via through the encapsulant.

8. The method of claim 6, further including forming the trench extending over the semiconductor die.

9. The method of claim 6, further including forming the trench outside a footprint of the semiconductor die.

10. The method of claim 6, further including forming the conductive substrate to include a protrusion extending from a surface of the conductive substrate.

11. The method of claim 6, further including forming a plurality of trenches through the conductive substrate to create a plurality of contact pads.

12. A method of making a semiconductor device, comprising:
    providing a substrate;
    disposing a semiconductor die over the substrate;
    forming an interconnect structure over the semiconductor die; and
    forming a trench through the substrate after disposing the semiconductor die over the substrate.

13. The method of claim 12, further including:
    depositing an encapsulant over the semiconductor die; and
    forming a conductive via through the encapsulant.

14. The method of claim 12, further including forming a plurality of trenches through the substrate to form a plurality of contact pads.

15. The method of claim 12, further including forming the trench extending over the semiconductor die.

16. The method of claim 12, further including providing the substrate to include a leadframe.

17. The method of claim 12, further including providing the substrate to include a protrusion extending from a surface of the substrate.

18. The method of claim 12, further including forming the trench outside a footprint of the semiconductor die.

19. A semiconductor device, comprising:
    a substrate;
    a semiconductor die disposed over the substrate;
    an encapsulant deposited over the substrate and semiconductor die; and
    an opening formed in the substrate and extending into the encapsulant.

20. The semiconductor device of claim 19, wherein a continuous portion of the substrate is disposed over the semiconductor die.

21. The semiconductor device of claim 19, wherein the substrate includes a protrusion extending into the encapsulant.

22. The semiconductor device of claim 19, further including a conductive via formed through the encapsulant over the substrate.

23. The semiconductor device of claim 19, further including an interconnect structure formed over the semiconductor die and electrically connected to the substrate.

24. The semiconductor device of claim 19, wherein the opening extends over the semiconductor die.

* * * * *